US010118200B2

(12) United States Patent
Linde et al.

(10) Patent No.: US 10,118,200 B2
(45) Date of Patent: Nov. 6, 2018

(54) SYSTEM AND METHOD FOR BINNING AT FINAL TEST

(75) Inventors: Reed Linde, El Dorado Hills, CA (US); Gil Balog, Jerusalem (IL)

(73) Assignee: OPTIMAL PLUS LTD, Holon (IL)

( * ) Notice: Subject to any disclaimer, the term of this patent is extended or adjusted under 35 U.S.C. 154(b) by 1109 days.

(21) Appl. No.: 12/497,798

(22) Filed: Jul. 6, 2009

(65) Prior Publication Data
US 2011/0000829 A1 Jan. 6, 2011

(51) Int. Cl.
B07C 5/344 (2006.01)
B07C 3/12 (2006.01)
G01R 31/317 (2006.01)
G01R 31/28 (2006.01)

(52) U.S. Cl.
CPC ............. B07C 5/344 (2013.01); B07C 3/12 (2013.01); G01R 31/31718 (2013.01); G01R 31/2894 (2013.01)

(58) Field of Classification Search
CPC ....... B07C 5/344; B07C 3/12; G01R 31/2851; G01R 31/2893; G01R 31/275; G01R 31/317
USPC .................... 209/571, 573; 700/223; 714/724
See application file for complete search history.

(56) References Cited

U.S. PATENT DOCUMENTS

| 5,400,263 | A | | 3/1995 | Rohrbaugh et al. |
|---|---|---|---|---|
| 6,055,463 | A | * | 4/2000 | Cheong et al. ............... 700/223 |
| 6,223,098 | B1 | | 4/2001 | Cheong et al. |
| 6,499,123 | B1 | * | 12/2002 | McFarland et al. .......... 714/724 |
| 6,782,500 | B1 | | 8/2004 | Madge et al. |
| 6,792,373 | B2 | | 9/2004 | Tabor |
| 6,857,090 | B2 | | 2/2005 | Lee et al. |
| 7,700,891 | B2 | * | 4/2010 | Uekert et al. ................. 209/573 |
| 8,712,718 | B1 | * | 4/2014 | Camarota et al. ............ 702/117 |
| 2005/0071103 | A1 | * | 3/2005 | Deng ............... G05B 19/41875 702/84 |
| 2005/0075835 | A1 | | 4/2005 | Tseng et al. |
| 2007/0007946 | A1 | * | 1/2007 | Uekert et al. ............... 324/158.1 |
| 2009/0013218 | A1 | * | 1/2009 | Rousseau ............ G06F 11/2268 714/48 |

OTHER PUBLICATIONS

Madge et al.; "In search of the optimum test set—adaptive test methods for maximum defect coverage and lowest test cost" IEEE ITC International Test Conference 203-212 (2004).
"Guidelines for Part Average Testing"; AEC-Q001-Rev-C, Jul. 18, 2003.
"The intelligent interface between your prober and the future" Salland Engineering.

(Continued)

Primary Examiner — Joseph C Rodriguez
Assistant Examiner — Kalyanavenkateshware Kumar
(74) Attorney, Agent, or Firm — Kilpatrick Townsend & Stockton LLP

(57) ABSTRACT

Systems and methods for sorting an electronic device undergoing a final test operation in accordance with a test program, into one of a plurality of bins. In one embodiment, an evaluator defines the binning of the electronic device while the device is still socketed, and the defined binning may or may not concur with the binning assigned by the test program.

28 Claims, 6 Drawing Sheets

(56) References Cited

OTHER PUBLICATIONS

Cabbibo et al. "Fee forward test methodology utilizing device identification" IEEE ITC International Test Conference; 655-660 (2004).
O'Donnell; "Generated in real-time instant process statistics (GRIPS): immediate, tester-computed test statistics, eliminating the post-processing of datalogs" IEEE International Test Conference; 471-477 (1993).
"Dynamic parts average testing in real-time" Southwest Test Workshop; Jun. 8, 2005.
"Dynamic test cell controller, test cost reduction at no compromise in wafer sort operations" Salland Engineering (2006.
"Meeting the new challenges of test"; Southwest Test Workshop, Jun. 8, 2005.
Benitez et al.; "Test SPC: A process to improve test system integrity" IEEE, International Test Conference; 224-232 (1995).
Pintail Technologies, Inc., Corporate Overview, PowerPoint Presentation (Sep. 2004).

\* cited by examiner

SYSTEM AND METHOD FOR BINNING AT FINAL TEST

FIELD OF THE INVENTION

The invention relates to electronic device testing.

BACKGROUND OF THE INVENTION

Test operations involved in the manufacturing of electronic devices are commonly performed using commercial or custom Automated Test Equipment (ATE), often in conjunction with and under limited control of a test station host computer that provides management of manufacturing operations for one or more such ATE tools. The manufacturing test flow usually involves several test steps, some performed while electronic devices remain integrated on the surface of a single semiconductor wafer, and some performed on electronic devices after the wafer has been sawed into pieces consisting of singulated electronic devices. Sometimes, the singulated electronic devices are assembled into packages before the singulated electronic device testing is performed. Testing done on an electronic device contained on a wafer is referred to as "sort test", and testing done on a singulated electronic device is referred to as "final test", or sometimes "package test".

The ATE (also referred to below as the "tester") performs real-time control of the electronic test sequences and test conditions that are applied to the (electronic) devices-under-test (DUTs). This is enabled through a test program executing on one or more test site controller central processing units (CPUs), depending on system architecture, which control the pin electronics and power supplies that drive collections of test sites on the tester. Specification, for example, of the test content for the desired signal transition timing, voltage or current levels, pass/fail limit thresholds, vector/data sequences, test subroutine and pattern content, test flow branching, etc. is made through a combination of vector/pattern memory data files and compiled or linked test program files, created using custom tester-specific programming languages and a library of application programming interface (API) functions.

The test station host computer functions are generally limited to those facilitated by a factory automation (or workflow) interface to the ATE, typically including automated or manual material loading procedures, test program loading and test process initiation procedures, initiation of tester calibration procedures, test data buffering/archival, test and tester status indicators, tool utilization tracking and tool problem response procedures.

In a typical test system at final test, a test station unit handler, commonly referred to simply as a "handler", serves to physically insert the singulated devices into sockets to provide electrical connection to the tester in preparation for testing. After testing has been performed, the handler removes the devices from the sockets and places them into physically separate containers, referred to as "bins", under direction of the test program, and according to the test results of each individual device. Typically, the designated handler bin, derived from the pass/fail response of a DUT to the test sequence administered by the test program and determined by the test program is passed from the test program to a system controller on the tester and then to the handler through a handler interface without modification, except for any necessary data formatting that may be required for compliance with interface protocols.

The binning signals that are passed from the ATE to the handler instruct the handler to physically remove the DUT(s) that have completed testing from test sockets and to place them in the indicated bins. Typically, devices are sorted according to whether they passed or failed testing, and further, may in some cases be classified and sorted according to passing and failing sub-categories. The handler construction may in some cases limit the number of physical bins into which tested devices may be placed. A typical handler has on the order of eight bins available for this purpose, but the number of available bins may vary in different implementations.

Frequently the test procedures described above are applied to multiple devices at multiple test sites in parallel. At final test, the handler may insert multiple devices into test sockets to prepare them for parallel testing, the ATE (under test program control) may apply and evaluate test signals from all of these devices simultaneously, and may then, based on the test results, direct the handler through the ATE-handler interface to distribute each of the tested devices into the appropriate bin for that device. By testing groups of devices in parallel, in this fashion, the effective rate of processing devices through a final test manufacturing operation (e.g., the number of parts tested per hour) is increased over what it would be for a serial test operation.

SUMMARY OF THE INVENTION

According to the present invention, there is provided a system for sorting an electronic device undergoing a final test operation in accordance with a test program, into one of a plurality of bins, comprising: an evaluator to define a permanent binning assignment for an electronic device inserted in a socket of a final test operation, wherein the permanent binning assignment may or may not concur with a provisional binning assignment for the electronic device defined by a test program of the final test operation, and to output the permanent binning assignment so that after the final test operation is completed, the electronic device is removed from the test socket and placed in one of the plurality of bins in accordance with the permanent binning assignment.

According to the present invention, there is also provided a method of sorting an electronic device undergoing a final test operation in accordance with an electronic device test program, into one of a plurality of bins, comprising: defining a permanent binning assignment for an electronic device inserted in a socket of a final test operation, wherein the permanent binning assignment may or may not concur with a provisional binning assignment for the electronic device defined by a test program of the final test operation; and outputting the permanent binning assignment so that after the final test operation is completed, the electronic device is removed from the test socket and placed in one of the plurality of bins in accordance with the permanent binning assignment.

According to the present invention, there is further provided a program storage device readable by machine, tangibly embodying a program of instructions executable by the machine to perform a method of sorting an electronic device undergoing a final test operation in accordance with a test program, into one of a plurality of bins, comprising: defining a permanent binning assignment for an electronic device inserted in a socket of a final test operation, wherein the permanent binning assignment may or may not concur with a provisional binning assignment for the electronic device defined by a test program of the final test operation; and outputting the permanent binning assignment so that after the final test operation is completed the electronic device is removed from the test socket and placed in one of the plurality of bins in accordance with the permanent binning assignment.

According to the present invention there is still further provided a computer program product comprising a computer useable medium having computer readable program code embodied therein of sorting an electronic device undergoing a final test operation in accordance with a test program, into one of a plurality of bins, the computer program product comprising: computer readable program code for causing the computer to define a permanent binning assignment for an electronic device inserted in a test socket of a final test operation, wherein the permanent binning assignment may or may not concur with a provisional binning assignment for the electronic device defined by a test program of the final test operation; and computer readable program code for causing the computer to output the permanent binning assignment so that after the final test operation is completed the electronic device is removed from the test socket and placed in one of the plurality of bins in accordance with the permanent binning assignment.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EMBODIMENTS

Figure 1A:
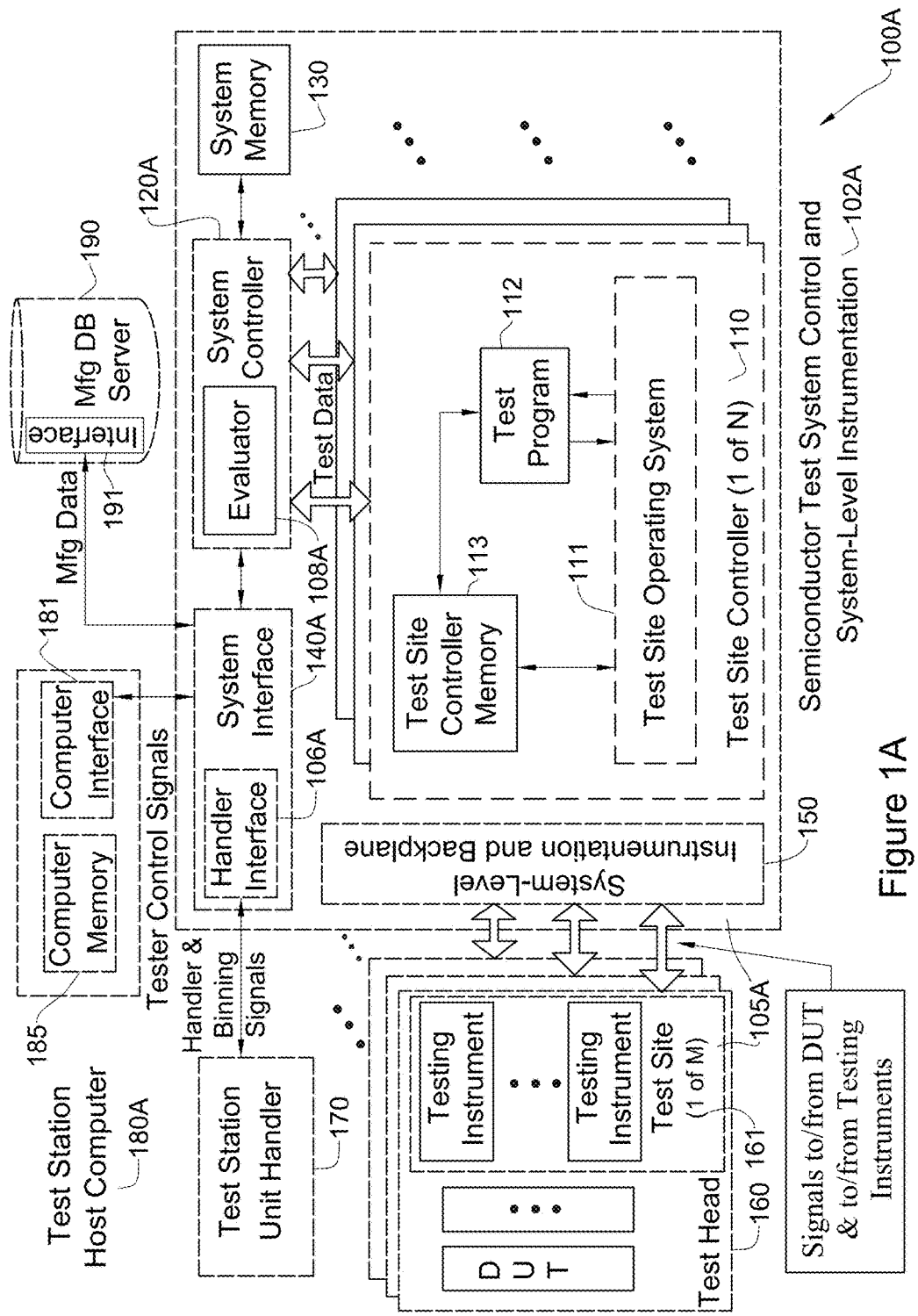
FIG. 1A shows an Electronic Device Test System, according to some embodiments of the present invention.

Described herein are embodiments of the current invention for sorting electronic devices undergoing a final test operation into bins.

As used herein, the phrases "for example," "such as", "for instance", and variants thereof describe non-limiting examples of the present invention.

In the following detailed description, numerous specific details are set forth in order to provide a thorough understanding of the invention. However, it will be understood by those skilled in the art that the present invention may be practiced without these specific details. In other instances, well-known methods, procedures and components have not been described in detail so as not to obscure the present invention.

Reference in the specification to "one embodiment", "an embodiment", "some embodiments", "another embodiment", "other embodiments", "one instance", "some instances", "one case", "some cases", "other cases" or variants thereof means that a particular feature, structure or characteristic described in connection with the embodiment(s) is included in at least one embodiment of the invention. Thus the appearance of the phrase "one embodiment", "an embodiment", "some embodiments", "another embodiment", "other embodiments" one instance", "some instances", "one case", "some cases", "other cases" or variants thereof does not necessarily refer to the same embodiment(s).

It should be appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Unless specifically stated otherwise, as apparent from the following discussions, it is appreciated that throughout the specification discussions utilizing terms such as "defining", "considering", "receiving", "accessing", "inserting", "removing", "performing", "testing", "assigning", outputting", "obtaining", "determining", "processing", "using", or the like, refer to the action and/or processes of any combination of software, hardware and/or firmware. For example, one or more of these terms may refer in some cases to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include systems for performing the operations herein. These systems may comprise inter-alia specially constructed modules for the desired purposes, and/or or a general purpose computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus. Such a computer program may be written in any appropriate programming language.

Figure 1B:
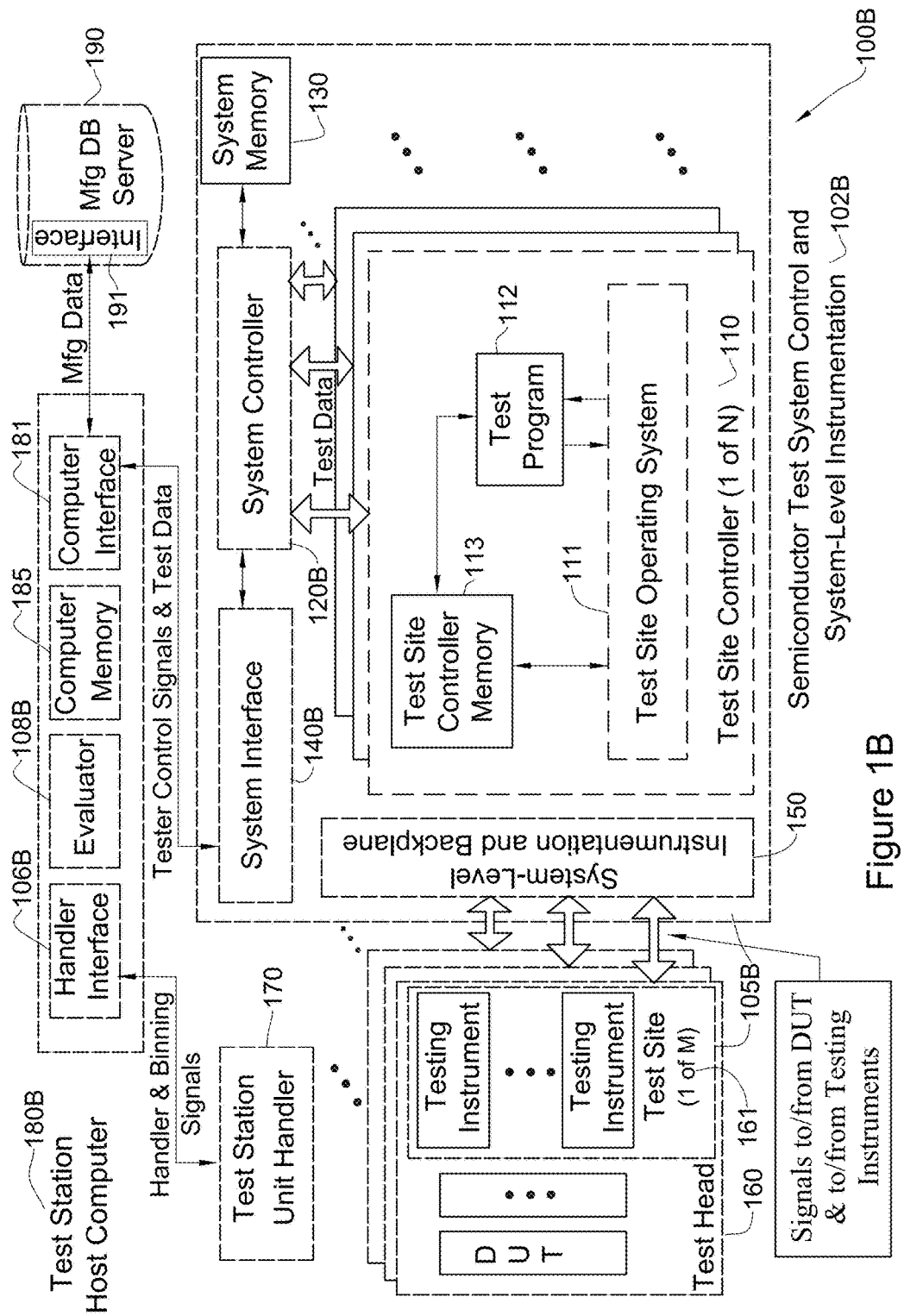
FIG. 1B shows an Electronic Device Test System, according to some other embodiments of the present invention.

Referring now to the figures in more detail, some embodiments of an Electronic Device Test System for a final test operation are illustrated in FIGS. 1A and 1B. For simplicity's sake, in the description herein a module is labeled with a number and the letter A or B when referring specifically to the module in FIG. 1A and FIG. 1B respectively. However a module is labeled with only a number when referring to the module in either FIG. 1A or 1B. FIG. 1A illustrates Electronic Device Test System 100A and FIG. 1B illustrates Electronic Device Test System 100B, according to various embodiments of the present invention. For the sake of example, it is assumed in the illustrated embodiments that Electronic Device Test System 100 (e.g. System 100A or 100B) is capable of testing N×M singulated devices in parallel (where N≥1, and M≥1 as discussed in more detail below).

In some embodiments, there may be a plurality of final test operations being performed on singulated devices, at a plurality of sockets. Therefore in these embodiments, Electronic Device Test System 100 may be applicable to only some or to all of the performed final test operations.

In the illustrated embodiments, Electronic Device Test System 100 comprises an Automated Test Equipment (ATE) system 105 (e.g. ATE 105A or 105B) a Unit Handler 170, and a Test Station Host Computer 180 (e.g. Test Station Host Computer 180A or 180B).

In the illustrated embodiments, ATE 105 includes a Semiconductor Test System Control and a System-Level Instrumentation 102 (e.g. Semiconductor Test System Control and System-Level Instrumentation 102A or 102B) and a Test Head 160.

In the embodiments of the invention, any of the modules in FIGS. 1A and 1B may be made up of any combination of software, hardware and/or firmware that performs the functions as described and explained herein. In some embodiments, Electronic Device Test System 100A and/or 100B may include fewer, more and/or different modules than shown in FIG. 1A and FIG. 1B respectively. In some embodiments, the functionality of Electronic Device Test System 100A and/or 100B may be divided differently than illustrated among the modules illustrated in FIG. 1A and FIG. 1B respectively. In some embodiments, Electronic Device Test System 100 may include additional, less, and/or different functionality than described herein.

In some embodiments, commercially available testers used for electronic device testing operations today, along with their operating systems, may be adapted to become tester 105A or 105B. As an example, the Verigy HP93K tester or the Teradyne J750 tester may be considered typical of such commercially available systems.

In some embodiments, the communication between unit handler 170 and other modules of System 100 (for example with a Handler Interface 106A or 106B) may occur, in some cases, via parallel digital communication, RS-232 serial communication, a Transmission Control Protocol/Internet Protocol TCP/IP network, a GPIB bus (General Purpose Interface Bus), also known as a IEEE-488 or HP-IB bus (Hewlett-Packard Instrument Bus), or by any other means of communication.

In some embodiments, Test Station Host Computer 180 is connected to a System Interface 140 (e.g. System Interface 140A or 140B) of Semiconductor Test System Control and System-Level Instrumentation 102 through an Ethernet connection, providing a communication conduit with a Test System Controller 120 (e.g. Test System Controller 120A or 120B) via a network protocol, such as TCP/IP.

Tester 105 applies electronic test sequences to the devices-under-test (DUTs) through one or more test programs 112 executing on one or more Test Site Controllers 110, which digitally control various instrumentation for generating physical test signals, such as pin electronics cards, pattern generator boards, power supplies, and the like, to drive test signals and to provide power to collections of test sites 161 on the tester. Such instrumentation is represented by System-Level Instrumentation and Backplane 150, as well as by instrumentation driving one or more DUTs, electrically connected to the test system backplane and located within Test Head 160, represented within M Test Site(s) 161 (M≥1). In one example, a single Test Site Controller 110 may control test instrumentation associated with multiple Test Sites 161 to test multiple DUTs in parallel, whereas in another example a single Test Site Controller 110 may control only a single test site for testing a single DUT, depending on ATE architecture. In either of these examples, ATE 105 includes N instances of Test Site Controller(s) 110 (N≥1) with the value of N depending on ATE architecture.

Specification of the test content, for example the desired signal transition timing, voltage or current levels, pass/fail criteria, vector/data pattern selection, vector/data pattern sequences, test subroutine and pattern content, test flow sequencing and branching, etc. is made through compiled or linked files constituting Test Program 112, created using custom tester-specific programming languages and a library of application programming interface (API) functions. A version of Test Program 112 executes on each instance of Test Site Controller 110, running under the local CPU and Test Site Operating System and Test Program Server 111. As DUT testing occurs, data generated by test instrumentation and by test program execution is written to Test Site Controller Memory 113.

To understand the benefit of some embodiments of the invention to test program management, one must appreciate that a test manufacturing operation may, at any instant of time, require support of hundreds of test programs. For example, a particular test program may be specific to a certain product, certain tester model, and/or certain test operation. Not only do changes to the test programs involve their editing, recompilation and deployment to test program network servers, but also change-control and validation activities for the new code are necessary, to ensure that the changes are correct. However, in some cases, an algorithm that affects binning may be applicable across products, testers, and/or test operations. In embodiments of the invention, an algorithm which affects binning may be implemented without modification of the test program, through the use of an Evaluator 108 (e.g. Evaluator 108A or 108B), whose functionality will be discussed in more detail below. The usage of Evaluator 108 fundamentally avoids the overhead of embedding a given algorithm within each of the multitude of test programs, placing the algorithm execution and control functionality instead in Evaluator 108. Embodiments of the invention thus provide a solution to the problem of how to efficiently deploy and maintain an algorithm across many products, many testers and/or many test operations, for periods of many years, to benefit from the capabilities provided, with minimal engineering effort. Herein, Evaluator 108 is described as executing an algorithm, but the single form should be understood to include both embodiments where the algorithm includes a plurality of sub-algorithms and embodiments where the algorithm is indivisible. The single form should also be understood to include embodiments where a particular Evaluator 108 always executes the same algorithm or is capable of executing different algorithms.

Test System Controller 120 is the overall controller of system test operations, including inter-alia the coordination of testing by the N Test Site Controllers 110. (In some cases with only one Test Site Controller, the functionality of Test System Controller 120 and Test Site Controller 110 may be merged into one controller, but in other cases, System Controller 120 and Test Site Controller 110 would still be separate.) In one embodiment, Test System Controller 120 coordinates communications among Test Site Controllers 110 (assuming more than one). In some embodiments with a plurality of Test Site Controllers 110, Test System Controller 120 alternatively or additionally supports operations relating to more than one Test Site Controller 110, for example relating to all Test Site Controllers 110 in one of these embodiments.

In the illustrated embodiments, the content of Test Site Controller Memory 113 is local to each Test Site Controller 110. To name just a few exemplary applications, the data stored in Test Site Controller Memory 113 may include inter-alia digital data controlling analog test instrumentation (such as D-to-A settings), digital data representing results of parametric test measurements (such as A-to-D test results), as well as purely digital data such as data to control signal timing and format, design-specific data specified for electronic device functional operations, control flags to track and evaluate in conditional test operations, and pass/fail counters and flags associated with individual tests within the sequence of tests of an integrated test flow. The short list of uses provided here is meant to illustrate how test site controller memory is used and how dynamic it may be during electronic device testing; many other possible applications and data types will occur to those skilled in the art.

Data generated in the course of testing a device by Test Program 112 are stored in the corresponding (local) Test Site Controller Memory 113, but may be globally accessed and/or modified through Test System Controller 120. For example, the data may be retrieved by System Controller 120 and copied into System Memory 130. Additionally or alternatively, the data generated in the course of testing may be formatted and sent to adjoining systems through System Interface 140. For example, the (formatted) data may be sent to Test Station Host Computer 180 and stored in Computer Memory 185 (see for example FIG. 1B where test data is shown transferred from System Interface 140B to Computer Interface 181). The formatted binary data may symbolize parametric variables data specific to the DUT that has been generated during its testing, and may also symbolize the classification of the DUT, according to its overall pass/fail response to an individual test or to a sequence of tests.

In the illustrated embodiments, System Memory 130 and/or Computer memory 185 include data from the present test operation. Such data may include any of the following inter-alia: data relating to any DUT(s) being currently tested at Test Site(s) 161, and/or data relating to recently tested DUTs (for example from the same test lot and test operation). Assuming as in the illustrated embodiments that Evaluator 108 has access to System Memory 130 and/or Computer Memory 185, Evaluator 108 will be able to access data from the present test operation.

Optionally, in some embodiments of the invention, System 100 includes a Manufacturing Database (DB) Server 190 and an Interface 191 to Server 190, thereby allowing Evaluator 108 to access data in Manufacturing Database (DB) Server 190. Manufacturing DB server 190 is assumed to include more extensive data than System Memory 130 and/or Computer Memory 185. For example, in one embodiment, Manufacturing DB Server 190 includes manufacturing data for all manufacturing lots, and for all test operations.

Evaluator 108 is situated in the path between Test Program 112 and Handler Interface 106, such that permanent binning instructions originating from Evaluator 108 are sent to Handler Interface 106, and not provisional binning assignments originating from Test Program 112 (although in some cases provisional and permanent assignments may be the same). FIGS. 1A and 1B illustrate two possible placements of Evaluator 108, according to various embodiments. However, in other embodiments, Evaluator 108 may be placed elsewhere in the path between Test Program 112 and Handler Interface 106. Similarly, FIGS. 1A and 1B illustrate two possible placements of Handler Interface 106, according to various embodiments. However, in other embodiments, Handler Interface 106 may be placed elsewhere in the path between Evaluator 108 and Test Station Unit Handler 170. Herein for ease of distinguishing between binning assignments, the term "provisional binning assignment" and the like are used to refer to a binning assignment originating from the test program, and the term "permanent binning assignment" and the like are used to refer to binning assignment originating from the evaluator. However no additional characteristics of the binning assignments should necessarily be construed from these terms.

In the illustrated embodiments of FIG. 1A, Evaluator 108A is located within System Controller 120A, and Handler Interface 106A is located within System Interface 140A or elsewhere on Semiconductor Test System Control and System-Level Instrumentation 102A. In these embodiments, Evaluator 108A shares system resources with System Controller 120A, with access to System Memory 130 and System Interface 140A. Therefore, all data generated by Test Program 112 that are available to System Controller 120A are also available to Evaluator 108A. In embodiments with Interface 191 to Manufacturing Database Server 190, there may be a connection between System Interface 140A and Server Interface 191 so that Evaluator 108A can access data within Manufacturing Database Server 190. (It is possible that in some embodiments where Handler Interface 106A is located on Semiconductor Test System Control and System-Level Instrumentation 102A, there may be another Handler Interface, for example in Test Station Host Computer, which is unused and/or disconnected from Test Station Unit Handler 170)

In the illustrated embodiments of FIG. 1B, Evaluator 108B is located in Test Station Host Computer 180B. Evaluator 108B therefore shares system resources with Test Station Host Computer 180B, with access to Computer Memory 185 and Computer Interface 181. Therefore, all data that are available to Test Station Host Computer 180B are also available to Evaluator 108B. In embodiments with Interface 191 to Manufacturing Database Server 190, there may be a connection between Interface 191 and Computer Interface 181 so that Evaluator 108B can access data within Manufacturing Database Server 190. In the illustrated embodiments, Handler Interface 106B is located in Test Station Host Computer 180B as to facilitate communication between Evaluator 108B in Test Station Host Computer 180B and Test Station Unit Handler 170. In some embodiments where Evaluator 108B is located in Test Station Host Computer 180B, in addition to Handler Interface 106B in Test Station Host Computer 180B, there may be a Handler Interface on Semiconductor Test System Control and System-Level Instrumentation 102B, which is unused and/or disconnected from Test Station Unit Handler 170. In either case, handler binning control signals to Unit Handler 170 originate from Test Station Host Computer 180B, rather than from Semiconductor Test System Control and System-Level Instrumentation 102B.

Regardless of whether or not Evaluator 108 is located in Test Station Host Computer 180, Host Computer 180 will in some embodiments provide operational support, such as providing configuration information and the various files required to define the test conditions of the particular type of electronic device to be tested, as well as information about the lot and wafer origins of the material being tested, initiation of tester initialization/calibration/test procedures, and the receipt and archival of any processed data generated during testing. In some embodiments, Host Computer 180 may also support additional module components not shown in FIG. 1A or 1B, such as computer terminals, networked test program servers, and/or networked data storage systems. In embodiments based on FIG. 1A where Evaluator 108A is not located in Test Station Host Computer 180A, Test Station Host Computer 180A is used only for operational control. In these embodiments, once the test module has been prepared for testing a set of electronic devices and the test program execution has begun, Host Computer 180A is uninvolved in the generation of test signals and in evaluation of the associated DUT response as testing occurs. These "real-time" tasks are relegated to Semiconductor Test System Control and System Level Instrumentation 102A.

In embodiments of the invention Unit Handler 170 serves to physically insert a singulated device into a socket to provide electrical connection to Tester 105 in preparation for a final test operation. After the testing a DUT, Test Program 112 defines a provisional binning assignment for the DUT. The provisional binning assignment is saved in Test Site Controller Memory 113 but is not passed to Unit Handler 170. In some of these embodiments, the provisional binning assignment is also saved in System Memory 130 and/or Computer Memory 185 and is therefore available to Evaluator 108. However, in other embodiments, the provisional binning assignment is not saved System Memory 130 and/or Computer Memory 185. Depending on the embodiment, Evaluator 108 may or may not refer to the provisional binning assignment when defining the permanent binning assignment.

In embodiments of the invention, Evaluator 108 defines a permanent binning assignment for the DUT which has undergone the final test operation. The definition of the permanent binning assignment by Evaluator 108 does not affect the execution of Test Program 112 nor require modification of Test Program 112. The permanent binning assignment is passed to Unit Handler 170 through Handler Interface 106. The binning signals that are passed to Unit Handler 170 instruct Handler 170 to physically remove the DUT from the test socket after Test Program 112 has been completed and to place the DUT in the bin indicated by the permanent binning assignment. Typically, devices are sorted according to whether they passed or failed testing, and further, may in some cases be classified and sorted according to passing and failing sub-categories. The handler construction may in some cases limit the number of physical bins into which tested devices may be placed. A typical handler has on the order of eight bins available for this purpose, but the number of available bins may vary in different implementations. As mentioned above, in some implementations the testing and binning may be executed on multiple DUTs in parallel.

Depending on the embodiment, the definition of the permanent binning assignment may or may not necessarily follow after the definition of the provisional binning assignment. For example, in an embodiment where Evaluator 108 requires the provisional binning assignment in defining the permanent binning assignment, the permanent binning assignment necessarily comes after the provisional binning assignment. If, however, the provisional binning assignment is not required for defining the permanent binning assignment, the permanent binning assignment does not necessarily follow after the provisional binning assignment and in some embodiments may occur concurrently to or may precede the provisional binning assignment.

In some cases the permanent binning assignment may concur with the provisional binning assignment, meaning the assigned bin is the same. In other cases, the permanent binning assignment may not concur with the provisional binning assignment. In cases where the permanent binning assignment differs from the provisional binning assignment, there is no limitation on the variation between assignments. For example, assuming different bins which contain devices of differing levels of test success, the permanent binning assignment may in one case assign a device to a "more successful" bin than would have the provisional binning assignment, whereas in another case the permanent binning assignment may assign a device to a "less successful" bin than would have the provisional binning assignment.

In some embodiments, there may be advantages that Electronic Device Test System 100 defines both provisional and permanent binning assignments. For example, in one embodiment, if the permanent binning assignment is found to concur with the provisional binning assignment sufficiently frequently under certain circumstances, it may be determined in those circumstances to eliminate the definition of the permanent binning assignment and bin in accordance with the provisional binning assignment. In another example, in one embodiment, if the permanent binning assignment is found to differ from the provisional binning assignment sufficiently frequently under certain circumstances, the cause of the difference may be investigated further.

Depending on the embodiment, Evaluator 108 may or may not perform part or all of the processing for defining the permanent bin assignment of a DUT while the DUT is still being tested. For example, in one embodiment data required for the processing, which originate from Test Program 112 execution at one or more points of the execution, are relayed to System Memory 130 and/or Computer Memory 185 as the data are generated and thus are accessible to Evaluator 108. In this embodiment, Evaluator 108 therefore performs at least part of the processing concurrently with Test Program 112 execution. However, regardless of whether or not the processing by Evaluator 108 is concurrent with Test Program 112 execution, the DUT remains inserted in the socket until Evaluator 108 completes the processing for defining the permanent bin assignment.

Depending on the embodiment, Evaluator 108 may or may not share resources with Test Program 112. In embodiments where the interfaces and/or the memory storage elements used by Evaluator 108, are separate from those used by Test Program 112, efficiencies may in some cases be enabled.

Depending on the embodiment, Evaluator 108 may or may not include additional abilities that are not available in Test Program 112. In embodiments where Evaluator 108 includes additional abilities not available to Test Program 112, there may be advantages to Evaluator 108 defining the permanent binning assignment because the additional abilities may optionally be utilized. Some examples of possible additional abilities that may be included in Evaluator 108 and not in Test Program 112 in certain embodiments are now elaborated upon.

In some embodiments, Evaluator 108 includes floating point math capabilities which are not present in Test Program 112. For example, in some of these embodiments, a test program operating environment with limited or non-existent floating point math capabilities is inefficient in execution of algorithms involving floating point calculation.

Continuing with the example, a test program without a floating point square root function could not calculate the standard deviation of Gaussian statistics in a single floating-point operation, and would need to utilize a mathematical series to approximate the value, which could possibly lessen the accuracy of a binning decision dependent upon the value. Continuing with the example, calculation of the standard deviation may be used in an algorithm, for instance, which segregates devices that have power consumption levels greater than 3 standard deviations above the mean of previously tested devices at final test.

Additionally or alternatively, in some embodiments, Evaluator 108 has access to a larger amount of random access memory RAM (for example RAM in System Memory 130 and/or Computer Memory 185) than Test Program 112 has (for example RAM in Test Site Controller Memory 113). A test program operating environment with an insufficient amount of RAM to support both the requirements of physical test execution and algorithm execution will be inefficient in execution of algorithms demanding a large amount of RAM. For example, an algorithm requiring a sorting operation on a large array of numbers could be done with little RAM utilizing a "shell sort" in which pairs of numbers are compared and interchanged if out of order, at the cost of performance. A much faster sort operation could be done utilizing a "pigeonhole sort" in which each number is stuffed into a predefined set of sequenced memory locations, however, much more RAM would be needed. Continuing with the example, sorting may be used in an algorithm, for instance, which segregates devices that have consumption levels greater than the power consumption level of 99% of previously tested devices at final test.

Additionally or alternatively in some embodiments, Evaluator 108 can process a larger amount of operations per unit time than Test Program 112. A test program operating environment with an insufficient number of operations per unit time to achieve both the physical test throughput desired as well as the execution of a complex test algorithm may prevent satisfactory test performance. For example, an algorithm may be run within the test program that increases its execution time by 5%, causing overall testing throughput to be reduced by 5%.

Additionally or alternatively, in some embodiments, Evaluator 108 has a shorter disk access response time than Test Program 112. For example, System Memory 130, Computer Memory 185 and/or Manufacturing Database Server 190 may comprise inter-alia hard disk(s). A test program operating environment with poor disk access response time may produce unsatisfactory physical test throughput when burdened in addition with an algorithm that requires frequent (or extended) read/write operations to local or network hard disks. For example, an algorithm that recovers an electronic identifier from the DUT (xy coordinates, wafer #, lot #), and then based on this index searches a database on hard disk (such as Manufacturing DB Server 190) for associated data required by the algorithm, introduces delays that depend on the I/O speed and interface performance. The delays will decrease overall testing throughput. This example assumes an embodiment where Test Program 112 has access to data in Manufacturing DB Server 190. In other examples Test Program 112 may not even have access to data in Manufacturing DB Server 190.

Additionally or alternatively, in some embodiments Evaluator 108 may alter test (pass/fail) limits as variables but Test Program 112 may not have that capability. In these embodiments, the real-time control of the physical testing applied to a DUT during a final test operation is generally limited to conditions specified within Test Program 112 prior to execution of the test operation. A test program operating environment in which test (pass/fail) limits cannot be altered as variables, but may only be changed as constants during test program compilation, would be unsuitable for any algorithm involving adaptive, dynamic, or variable test limits. Such a limitation would prevent algorithms of this type from being implemented within the test program.

In the illustrated embodiments, Evaluator 108 uses data in the execution of an algorithm to define the permanent binning assignment of the DUT. It is assumed that Evaluator 108 has access to the data that are available to Test Program 112, for example because such data are also saved in System Memory 130 Computer Memory 185 and/or Manufacturing Database Server 190. For example, in some embodiments where there are N Test Site Controllers 110, Test Program $112_x$ (where $1 \leq x \leq N$) only has access to data within Test Site Controller Memory $113_x$. In some of these embodiments, the data in Test Site Controller Memory $113_x$ relate to the final test operation that is currently being applied to one or more DUT(s) at the Test Site(s) 161 corresponding to the Test Site Controller $110_x$. Therefore at run-time in these embodiments, Test Program $112_x$ would have access only to test data derived from the DUT(s) currently being tested for pass/fail evaluation and binning decisions.

Depending on the embodiment, Evaluator 108 may or may not have access to additional data not available to Test Program 112. In embodiments where Evaluator 108 has access to additional data not available to Test Program 112, it may be advantageous for Evaluator 108 to define the permanent binning assignment because the binning assignment may optionally consider the additional data. The advantages may in some cases be even more dramatic if the data are dynamic for example, changing with time and/or with the material being tested. Some examples of data which in some cases may be available to Evaluator 108 but not to Test Program 112 in certain embodiments are now elaborated upon.

In some embodiments, where there is a plurality of Test Site Controllers 110 testing DUTS in parallel in the current final test operation, the data relating to all currently tested DUTs are copied (or reformatted and copied) from the various Test Site Controller Memories 113 to System Memory 130 and/or Computer Memory 185. If Evaluator 108 has access to System Memory 130 and/or Computer Memory 185, then in these embodiments Evaluator 108 has access to data relating to the current final test operation on all the DUTs that are being tested in parallel. Therefore, when defining a permanent binning assignment for a particular DUT being tested by Test Site Controller $110_x$, Evaluator 108 may in some cases consider inter-alia data relating to the current final test operation on DUT(s) being tested in parallel at test site(s) 160 corresponding to one or more other Test Site Controller(s) 110. In these cases, the data considered may relate to all DUTs being tested in parallel or to a subset of DUTs being tested in parallel. In some of these embodiments, however, it is assumed that Test Site Controller Memory $113_x$ only includes data relating to the current final test operation on DUT(s) being tested at test site(s) 160 corresponding to Test Site Controller $110_x$. Therefore, in these embodiments, when defining the provisional binning decision, Test Program $112_x$ cannot consider data relating to DUT(s) being tested in parallel at test site(s) 160 corresponding to one or more other Test Site Controller(s) 110.

In some embodiments, additionally or alternatively, data relating to the same final test operation for previously tested DUTs remain in System Memory 130 and/or Computer Memory 185, for some time. For example, in some cases, data relating to a certain lot may remain in System Memory 130 and/or Computer Memory 185 until testing of the lot is complete. As another example, in some cases, System Memory 130 and/or Computer Memory 185 include data on the last certain number of units tested. Assuming Evaluator 108 has access to System Memory 130 and/or Computer Memory 185, Evaluator 108 has access to data relating to all DUTs from the same lot (or data relating to a certain number of units) which have been previously tested in the same final test operation. Therefore, when defining a permanent binning assignment for a particular DUT Evaluator 108 may in some cases consider inter-alia data relating to the same final test operation previously executed on a given collection of DUT(s) (for example devices from a common lot, sub-lot, wafer, or sub-wafer origin). In some of these embodiments, however, it is assumed that after a DUT has been removed from the test socket, data relating to the DUT are erased from Test Site Controller Memory 113, and therefore Test Site Controller Memory 113 does not include data relating to any DUT which has been removed from the test socket. Therefore, in these embodiments, when defining the provisional binning decision, Test Program 112 cannot consider data relating to previously tested DUT(s).

In some embodiments, additionally or alternatively, Evaluator 108 has access to data in Manufacturing Database Server 190 (through interface 191), for example in a client server configuration, whereas Test Program 112 does not have access to data in Manufacturing Database Server 190. Therefore in these embodiments, when defining a permanent binning assignment for a particular DUT, Evaluator 108 may in some cases consider inter-alia data from Manufacturing Database Server 190. Examples of data which in some embodiments may be included Manufacturing Database Server 190 will now be discussed.

In some embodiments, Manufacturing Database Server 190 may include data derived from manufacturing operations that preceded the current final test operation (for example data from fabrication, wafer sort, etest operations, assembly/packaging and/or earlier final test operations) relating to the particular DUT.

In some embodiments, additionally or alternatively Manufacturing Database Server 190 may include data derived from manufacturing operations that preceded the current final test operation (for example data from fabrication, wafer sort, etest operations, assembly/packaging and/or earlier final test operations) relating to other DUTs and/or which are not device-specific. In some of these embodiments where the data relate to other DUTs, the other DUTs are related to the particular DUT (for example same wafer of origin or lot of origin), whereas in other embodiments the other DUTs are not necessarily related to the particular DUT. As an example of the latter embodiments, Manufacturing Database Server 190 may contain week-by-week trends of oxide film thickness measurements taken during wafer fabrication, derived from a sample of measurements made on only a few points on a few wafers from each lot.

In some embodiments, additionally or alternatively Manufacturing Database Server 190 may include data derived from manufacturing operations that follow the current final test operation (for example data from later final test operations, post burn-in testing, cold temperature testing, quality assurance testing, yields, and/or reliability monitoring) relating to other DUTs and/or which are not device specific. For example, in one of these embodiments, based on the failure rates of devices in a subsequent operation a judgment of reliability risk may be made. In this example, dependent on the perceived reliability risk, the failure limit used when determining the binning assignment can be made tighter or looser.

In some embodiments, additionally or alternatively Manufacturing Database Server 190 may specify the identity of devices requiring segregation. For example, in one of these embodiments, there may be a list of device identifier data for devices that are to be physically separated for custom operation. Continuing with the example, after obtaining the device identifier data during testing, such as fabrication lot and wafer origin, these data may be compared to a list of fabrication lots and/or specific wafers whose packaged devices need to be segregated from others in order to receive non-standard processing (the list being prepared and stored within Manufacturing Database Server 190 in advance of the final test operation). For instance, the list may specify material whose fabrication process history includes features that are believed to warrant increased burn-in after packaging in order to mitigate reliability concerns. In this example, by identifying and segregating such devices at final test, those units (and only those units), for instance, may receive the required special burn-in treatment.

In some embodiments, additionally or alternatively Manufacturing Database Server 190 may specify dynamic criteria for device segregation and/parameters on which binning depend. For example, in one of these embodiments, there may be a dynamic manufacturing burn-in equipment capacity metric, upon which the threshold for assigning devices to a bin destined for the burn in operation depends. Continuing with the example, the amount of manufacturing burn-in equipment capacity available may be maintained and routinely updated in Manufacturing Database Server 190, to be retrieved for each device during final test and used as a factor to determine which units are segregated for burn-in processing, or to apportion and segregate units for burn-in of various durations, depending on the amount of available burn-in manufacturing capacity and on the relative reliability risk assigned to the material being tested. In this example, a simple algorithm might use iddq current at final test as a reliability risk indicator, and depending on iddq current level and on the dynamic data on manufacturing burn-in capacity available, may assign tested devices to bins that will receive burn-in duration of zero hours (low iddq and low capacity), two hours (low iddq and high capacity), four hours (high iddq and low capacity), or six hours (high iddq and high capacity). Thus in this example, an improvement over a static specification of six hours of burn-in for all devices is realized. Device reliability risk is mitigated, while manufacturing costs are managed through optimized burn-in capacity utilization.

In some embodiments, additionally or alternatively, Manufacturing Database Server 190 may include various operational details, special custom processing flags and/or any appropriate information.

It is noted that even in embodiments where Evaluator 108 has access to various types of data, for example as described above, Evaluator 108 does not necessarily consider all accessible data in defining the permanent binning assignment. The data considered by Evaluator 108 in defining the permanent binning assignment is not limited by the invention. For example, in some embodiments, Evaluator 108 may only consider data relating to the current final test operation for a particular DUT when defining the permanent binning assignment for that DUT. In this example, in other embodiments Evaluator 108 may consider other data such as the data described above in addition to or instead of the data relating to the current final test operation for the particular DUT when defining the binning assignment for that DUT. As mentioned above, depending on the embodiment Evaluator 108 may or may not consider the provisional binning assignment when defining the permanent binning assignment. Therefore in embodiments where Evaluator 108 considers data on the current final test operation for a particular DUT in defining the permanent bin assignment for the DUT, the data on the current final test operation which is considered may or may not include the provisional binning assignment.

Evaluator 108 may consider one or more types of data in defining the permanent binning assignment. In some embodiments, the data considered by Evaluator 108 is parametric in nature, and in some embodiments functional data may be used. In some embodiments, both parametric and functional data may be considered. The meaning of the term "parametric data" in this context is data whose values are continuous (non-integer) in nature, and therefore may be represented by floating point numbers in the computing environment of Evaluator 108. Such parametric data may, for example, originate from a test measurement of a single physical parameter of a device, such as a current or voltage value. Parametric data may also be derived through computation or application of an algorithm, as explained in the following paragraph. The meaning of the term "functional data" in this context is data that are non-parametric in nature, often represented by Boolean values, text, logic flags, or integers in the computing environment of Evaluator 108. Such functional data may originate from execution of a test whose output includes a description of the operating states under which a DUT functions or does not function. Examples of functional data include the number of clock cycles required for a device to return from a given operation, the number of bitlines within a memory device that have been repaired with on-chip redundancy, and the collection of bits from electronically reading device identifier memory.

In some embodiments, Evaluator 108 may define the permanent binning assignment based on an algorithm that depends on statistical or relational functions of one or more parametric or functional data-sets derived from the testing of a population of devices at a given test operation (see for example description of methods 200, 300 and 400 below). In such embodiments the data from the population of devices may be mathematically or algorithmically combined, and the resulting value(s) may be applied in binning determination. For example, among the many possibilities, the mean or standard deviation of the population data may be computed, or the measurements from the population of devices may be sorted and the median value may be selected. Continuing with additional examples, the yield of a population to a particular test may be computed or, more generally, the frequency or probability of occurrence of measurable functional test events may be calculated (e.g., calculation of the percentage of test operations within a device that fails to properly function at a certain Vdd level, calculation of the percentage of memory cells within a device that fails to operate above or below certain operational voltage thresholds, etc).

In some cases it may be impossible to modify Test Program 112 to include additional ability/ies possessed by Evaluator 108 in some embodiments of the invention. Additionally or alternatively, in some cases it may be impossible to modify Test Program 112 to have access to the additional data available to Evaluator 108 in some embodiments of the invention. In other cases it may be possible to modify Test Program 112 to include additional ability/ies and/or to have access to the additional data, but impractical. For example, adding additional tasks to Test Program 112 which take advantage of the additional abilities and/or take advantage of the additional data may be impractical if consequently test program execution and thus test time rises unacceptably.

Additionally or alternatively, it may be impractical to modify Test Program 112 in embodiments where the same Evaluator 108 may be used for different test programs. In these embodiments, the usage of Evaluator 108 avoids the engineering effort, money and time that would have been expended if multiple test programs were instead modified for defining binning assignment.

For example, in one of these embodiments an algorithm for defining binning assignment that has no product-specific requirements may be implemented by Evaluator 108 and therefore outside of the test program to be applied "generically" to all products. This approach may in some cases be advantageous in avoiding the problem otherwise of maintaining engineering staffing to update product-specific test programs indefinitely, even years after a product has entered manufacturing, simply to support subsequent incidental updates or changes to the algorithms.

As another example, in one of these embodiments, an algorithm that additionally or alternatively has no tester-specific requirements may be implemented by Evaluator 108 and therefore outside of the test program to be applied "generically" to all tester types. This approach avoids the task of otherwise updating embedded identical algorithms in all test programs individually when a new model of tester supersedes a previously used model.

As another example, in one of these embodiments, an algorithm that additionally or alternatively has no test-operation-specific requirements may be implemented by Evaluator 108 and therefore outside of the test program to be applied "generically" to all final test operations. This approach avoids the need otherwise of replicating identical algorithms within each operation-specific test program used in manufacturing, which often involves a flow including several consecutive test operations. For example, assume an algorithm which detects an increase in tester contact resistance signaling the need to clean the contacts, and which is therefore applicable to any final test operation. In this example, the same algorithm when implemented by Evaluator 108 can be applied to all final test operations undergone by a product without the need of replication within each operation specific test program.

The invention does not limit the algorithm used by Evaluator 108 in defining the permanent binning assignment. Many algorithms for testing electronic devices may be incorporated in embodiments of this invention. Examples include inter-alia pass/fail limits based on various parametric statistical metrics, such as Cp, Cpk, mean, median, standard deviation, robust standard deviation, and distribution percentile points, calculated based on distributions of parts of common lot, sub-lot, wafer, or sub-wafer origin. Other examples include inter-alia statistical bin limits, consecutive bin limits, total bin limits, static part average testing, dynamic part average testing, moving limit part average testing, and WECO rule and parametric trend algorithms Other examples include inter-alia algorithms that combine disparate data, or data from multiple sources, in defining evaluation and binning criteria, including manufacturing and test data feed-forward algorithms, manufacturing and test data feed-backward algorithms, unit-level predicted yield algorithms, current or measurement ratio test algorithms, nearest-neighbor residual algorithms, bivariate and multivariate regression residual statistical algorithms, and statistical algorithms based on principal components of analysis techniques. Other examples include inter-alia customized criteria for the algorithmic selection of QA, FA, and characterization sample material from the larger body of material processed through final test operations, including binning criteria based partly on matching identifying data electronically read from the device during the final test operation to a predefined list of devices of interest. In listing the above possibilities, the intent is not to limit the applications of the invention to those listed, but rather to convey the broad range of potential uses.

In embodiments of the invention, a virtually unlimited number of customized algorithms may be created and usefully applied, for example, by the end user of System 100. This fact is based on the potential number of combinations of data on which an algorithms may be based, some of which were described above, along with the range of values of variables or constants that may be incorporated (for example, in defining numerical limits to which parametric data may be compared for pass/fail determination).

Some examples of algorithms will now be discussed in more detail below. It should be understood that the various examples described in detail below offer only a few illustrations of the many possible ways in which embodiments of the invention may be applied, and that the examples are not meant to limit in any way the possible algorithms that can be implemented in embodiments of this invention.

An example of a test algorithm is the "Dynamic Part Average Testing" or "D-PAT" algorithm described in spec AEC-Q001 Rev-C of the Component Technical Committee of the Automotive Electronics Council, published Jul. 18, 2003. This algorithm permits the acceptance limits of an electronic parameter to be dynamically adapted to the statistical characteristics of parametric data derived from a set of parts being tested, such that the parametric test (pass/fail) limit will be adjusted with the testing of each successive part.

The D-PAT algorithm, as described in this AEC spec, will now be briefly summarized:

Part I—Defining Static Part Average Test ("S-PAT") Limits

The following procedure is performed on a sample of parts in advance of applying the D-PAT algorithm:
1. Collect parametric test data from at least six manufacturing lots that have passed fixed test limits as defined by the device specification.
2. Randomly select parametric test data from a minimum of 30 parts from each lot, to establish a reference population of N values.
3. Sort the resulting N values (where N≥180) in numerical order.
4. Determine "robust mean" and "robust sigma" values for the test parameter of interest.
   a. The "robust mean" is defined as the median of the distribution of the test data, determined by sorting the data and selecting the central value.
   b. The "robust sigma" determination requires extracting two values from the same set of sorted data, the first value being one-fourth of the way down the ranked list and the second value being three-fourths of the way down the ranked list. The "robust sigma" is defined as the difference between these two values, divided by 1.35.
5. Calculate the upper and lower Static PAT limits as "Robust Mean"±6*"Robust Sigma".

Part II—Defining and Applying D-PAT Limits

After establishing Static PAT limits as described in Part I, the D-PAT algorithm may be applied while sequentially testing a set of individual devices within a manufacturing lot. For each successive device:
1. Perform an electrical measurement of the parameter of interest from a device within a manufacturing lot under test
2. Compare the value of the measurement to the upper and lower Static PAT ("S-PAT") limits
3. If the value is greater than the upper S-PAT limit or less than the lower S-PAT limit, set a failure flag for the device
4. Else, if the device passes Static PAT limits:
   a. Calculate a Gaussian mean and standard deviation ("Sigma") using all data collected up to that point for the manufacturing lot under test, of which the current device is a member, by including the data from its electrical measurement with all previous data derived from the tested population of the manufacturing lot.
   b. Calculate upper and lower Dynamic PAT Limits as Mean±6*Sigma
   c. If the value of the current device measurement is greater than the upper D-PAT limit or less than the lower D-PAT limit, set a failure flag for the device When testing the current device is completed, examine the failure flag to determine the result.

Figure 2:
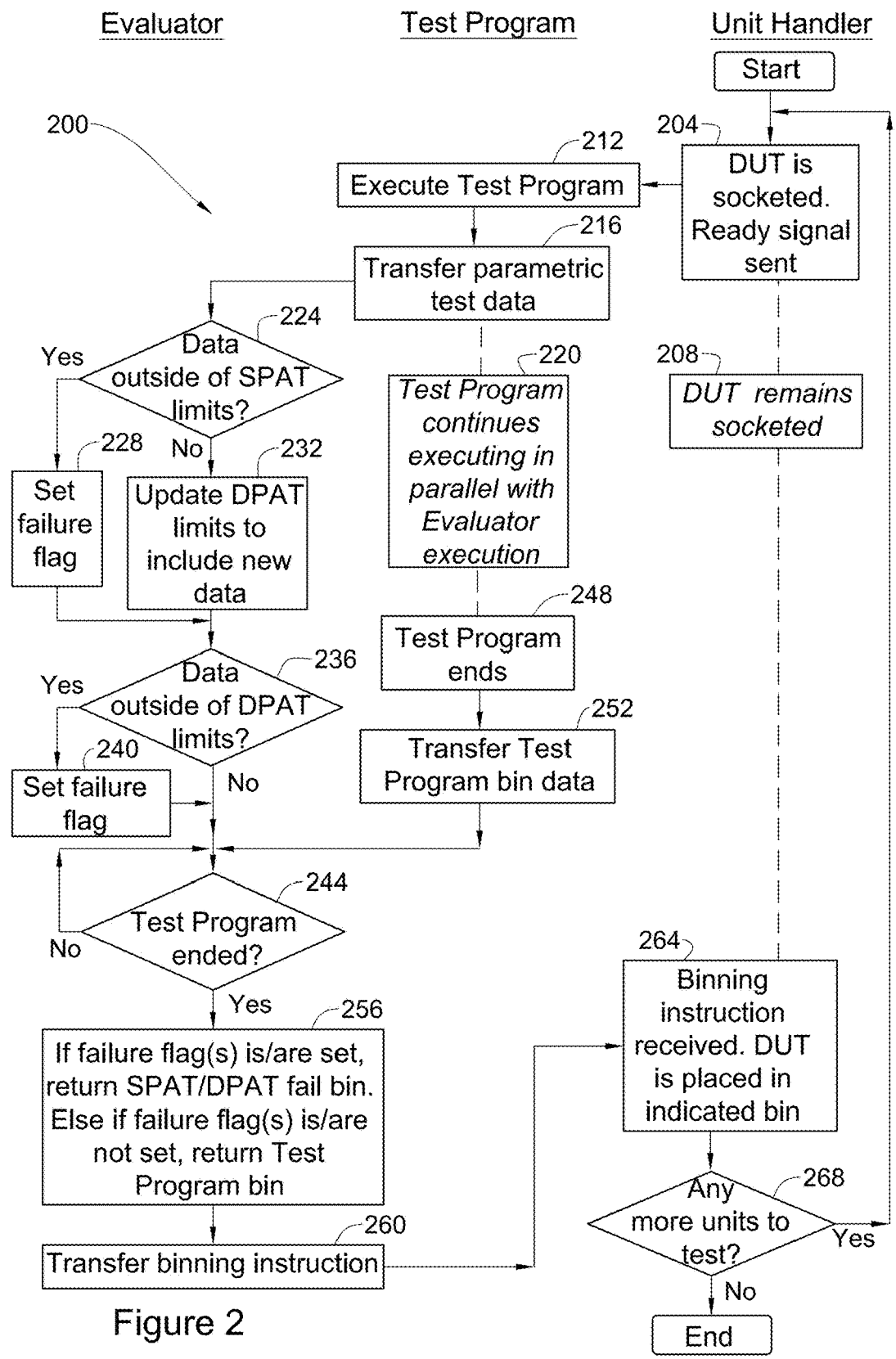
FIG. 2 is a flowchart of a method of using a Dynamic Part Average Test (D-PAT) algorithm at a final test operation in defining a permanent binning assignment, according to some embodiments of the present invention.

FIG. 2 is a flowchart of a method 200 of using the D-PAT algorithm at a final test operation in defining a permanent binning assignment, according to some embodiments of the invention. Method 200 is executed by System 100. The illustrated embodiments of method 200 show only Part II of the D-PAT algorithm described above since is assumed that Part I has already been completed and that the S-PAT limits have been established. For simplicity's sake, it is also assumed in the illustrated embodiments that only a single device is tested at a time (i.e. both N and M equal 1), although in other embodiments multiple devices may be tested at a time. In some embodiments, stages which are shown in FIG. 2 as being executed sequentially may be executed in parallel and/or stages shown in FIG. 2 as being executed in parallel may be executed sequentially. In some embodiments, method 200 may include more, less and/or different stages than illustrated in FIG. 2. In some embodiments, stages may be executed in a different order than illustrated in FIG. 2.

In order to apply the D-PAT algorithm at final test, the passing or failing status of a DUT at final test, and its (permanent) assignment to the appropriate handler bin during final test, requires the use of a combination of parametric test data derived from the current DUT and similar data from the previously tested devices of the same manufacturing lot. More specifically, in some embodiments the application of the algorithm requires the statistical analysis of all data of a given electronic parameter derived from conducting final test on the preceding units of a given manufacturing lot to establish the pass/fail threshold for evaluating the parametric data derived from a currently-socketed DUT from the same lot, and binning the DUT accordingly. Variations of the algorithm, or similar algorithms, may involve sorting large sets of floating point numbers, performing various floating point calculations, storing large arrays of floating point numbers (test measurements or calculation results), for example while physical testing is in progress, and then providing instructions to appropriately disposition the current DUT to a handler bin, for example when testing is complete.

In the illustrated embodiments in stage 204, Unit Handler 270 places the DUT to be tested in a test socket and then sends a "ready" signal. The DUT remains socketed (stage 208) until stage 264 (described below). Execution of Test Program 112 is initiated in stage 212. For example in System 100A, System Controller 220A receives the ready signal via Handler Interface 106A and then initiates execution of Test Program 112 As another example, in System 100B, Test Station Host Computer 180B receives the ready signal via Handler Interface 106B and then initiates execution of Test Program 112 by passing a "start test" instruction to System Controller 120B through System Interface 140B. During Test Program 112 execution, Test Program 112 sequentially executes a series of physical tests, including one or more tests producing parametric data-sets of interest, from which statistical features are later derived in stage 232 (see description below). In stage 216, the parametric data are transferred to Evaluator 108. For example, in System 100A, System Controller 120A may retrieve parametric data written to Test Site Controller Memory 113 and copy the data to System Memory 130, the data then being accessible to Evaluator 108A. As another example, in System 100B, System Controller 120B may retrieve parametric data written to Test Site Controller Memory 113, and send the data to Computer Memory 185 through System Interface 140B, the data then being accessible to Evaluator 108B. Test Program 112 continues execution of tests (stage 220), while Evaluator 108 executes in parallel beginning with stage 224.

In the illustrated embodiments in stage 224, Evaluator 108 compares the data to the high and low S-PAT limits (previously determined), and routes the flow through the passing path or failing path, accordingly. If failing, in stage 228 Evaluator 108 sets a failure flag. If passing, in stage 232 Evaluator 108 recalculates the high and low D-PAT limits to include the current (parametric) data value. In stage 236, Evaluator 108 compares the data to the updated high and low D-PAT limits, and routes the flow through the passing path or failing path, accordingly. If failing, in stage 240 Evaluator 108 sets a failure flag. If passing, no action is taken. Note that if more than one parametric data-set of interest is generated in the course of the physical testing performed by Test Program 112, then in some embodiments the stages described from stage 216 to stage 240 (inclusive) will be executed for each parametric data-set requiring processing by Evaluator 108, with one or more failure flags allocated to record the result(s) of the data evaluation (s) performed. Note also that, in some embodiments, the details of the algorithm applied may vary between the parameters whose data are being evaluated, such that Parameter A may be evaluated according to the conditions of Algorithm A, and Parameter B may be evaluated according to the conditions of Algorithm B, and so on. For example, Parameter A may be evaluated according to the D-PAT algorithm described above, in which pass/fail limits are defined by the value of the mean±6*standard deviation, while Parameter B may be evaluated instead according to pass/fail limits defined by the value of the "robust mean"±7*"robust sigma". Many other possible variations of such algorithms will occur to those versed in the art.

In the illustrated embodiments in stage 244, Evaluator 108 waits for Test Program 112, which has been continuing physical testing simultaneously, until Test Program 112 reaches its end in stage 248. In stage 252, after Test Program 112 has ended, the Test Program bin assignment (i.e. the provisional binning assignment) is transferred to Evaluator 108. For example, in System 100A, System Controller 120A may retrieve the provisional binning assignment from Test Site Controller Memory 113 and copy the provisional binning assignment to System Memory 130, the provisional binning assignment then being accessible to Evaluator 108A. As another example, in System 100B, System Controller 120B may retrieve the provisional binning assignment from Test Site Controller Memory 113 and send the provisional binning assignment to Computer Memory 185 through System Interface 140B, the provisional binning assignment then being accessible to Evaluator 108B. In stage 256 Evaluator 108 continues execution by overriding the Test Program (provisional) bin assignment if one or more of the algorithm failure flag(s) is/are set. Otherwise if no failure flag is set, Evaluator 108 allows the Test Program bin assignment to remain unchanged, meaning that the permanent binning assignment concurs with the provisional binning assignment. For the case in which the Test Program's bin assignment is overridden, and in which several handler bins are available for material segregation, the specific (permanent) bin reassignment by Evaluator 108 in stage 256 may be a function of the failure flags that have been set, or may be a function of a logical combination of the states of the various failure flags. For example, a device for which Parameter A failure is indicated by Failure Flag A may be assigned to Handler Bin A, while a device for which Parameter B failure is indicated by Failure Flag B may be assigned to Handler Bin B. Continuing with this example, a device that has been evaluated to fail the criteria for both Parameter A and Parameter B, as indicated by Failure Flag A and Failure Flag B, may be assigned to Handler Bin C.

In the illustrated embodiments in stage 260 the permanent binning assignment is transferred to Unit Handler 170. For example, in System 100A, System Controller 120A forwards the permanent bin assignment from Evaluator 108 to Unit Handler 170, via Handler Interface 106A. As another example, in System 100B Test Station Host Computer 180B forwards the permanent bin assignment from Evaluator 108B to Unit Handler 170, via Handler Interface 106B. The binning instruction is received by Unit Handler 170 in stage 264, causing Unit Handler 170 to remove the current DUT (whose testing has been completed) and to place the DUT in the indicated bin. In stage 268, Unit Handler 170 determines whether there are more untested devices remaining, and if so, returns to stage 204 to place the next DUT in the test socket. If there are no further devices to test, method 200 ends.

In the literature, there are also examples of "data-feed-forward" algorithms, such as those described in the paper "In Search of the Optimum Test Set—Adaptive Test Methods for Maximum Defect Coverage and Lowest Test Cost", by Robert Madge, et al., from the proceedings of the International Test Conference 2004. Several algorithms described within this paper require combining manufacturing data from prior operations, for example, from the e-test operation, with data from test operations that occur later in the manufacturing flow, and then using these results as the basis for pass/fail evaluation and binning.

Figure 3:
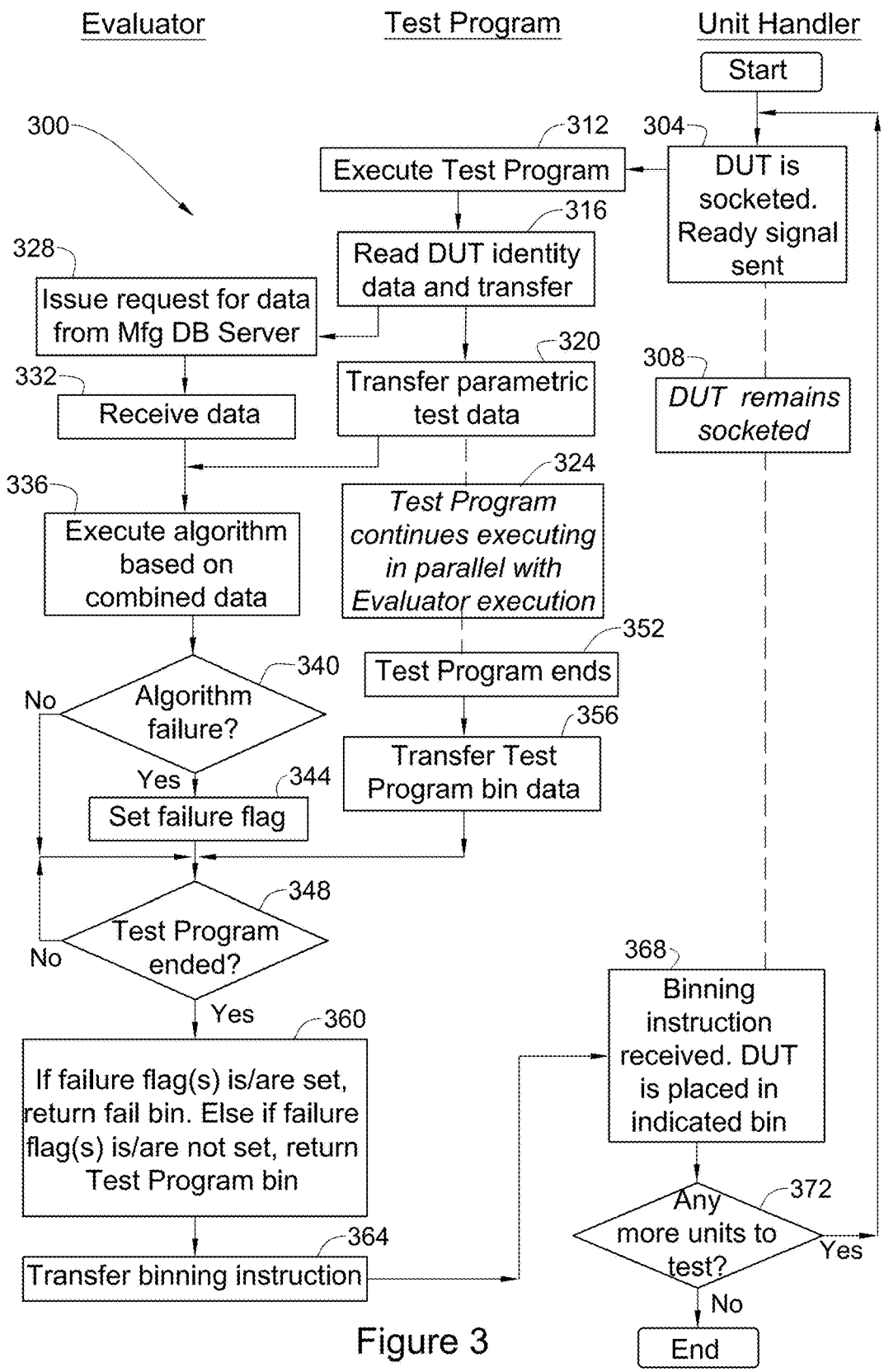
FIG. 3 is a flowchart of a method of using a data feed-forward algorithm at a final test operation in defining a permanent binning assignment, according to some embodiments of the present invention.

FIG. 3 is a flowchart of a method 300 of using a data feed-forward algorithm at a final test operation in defining a permanent binning assignment, according to some embodiments of the present invention. Method 300 is executed by system 100. For simplicity's sake, it is also assumed in the illustrated embodiments that only a single device is tested at a time (i.e. both N and M equal 1), although in other embodiments multiple devices may be tested at a time. In some embodiments, stages which are shown in FIG. 3 as being executed sequentially may be executed in parallel and/or stages shown in FIG. 3 as being executed in parallel may be executed sequentially. In some embodiments method 300 may include more, less and/or different stages than illustrated in FIG. 3. In some embodiments, stages may be executed in a different order than illustrated in FIG. 3.

Before describing FIG. 3, the reader needs to be acquainted with the common practice of including programmable logic elements in the designs of the integrated circuits currently produced, providing a small amount of non-volatile memory for storage of information used for engineering and/or manufacturing purposes. A common practice is to program device identifier data about the origin of each device in this non-volatile memory at the wafer sort operation, indicating the fabrication lot of origin, the wafer of origin, and possibly the X-Y coordinates locating the position of the individual device within the matrix of devices on the wafer. An electrical read operation may be performed on this memory at later points in the manufacturing flow, or even after a device has been shipped to a customer, in order to determine the device's origin. The traceability that this capability provides is particularly important after the individual integrated circuits contained within a wafer have been separated from one another during packaging into discrete "units". After packaging, the physical origin of the device becomes difficult to establish by any other means.

Since the present invention applies to devices under a final test operation, performed after devices have been singulated, the ability to reference relevant data in a manufacturing database in real-time as final test takes place will depend on the traceability capability described above. For the embodiments of the invention described in FIG. 3 to be practical, the design of the device in question must contain circuitry to permit the storage and retrieval of identifying data, and the manufacturing operations prior to device singulation must include a step in which identifying data is stored in the on-chip non-volatile memory.

In the illustrated embodiments of FIG. 3, it is assumed that the traceability capability described above has been implemented, and that the identifying data may be electronically read from the device during the final test operation. In such an embodiment, the identifying data are used as an index to any of various types of data specific to the DUT, or related to characteristics of the DUT, that may be extracted from Manufacturing DB Server 190 and then used by Evaluator 108. For further understanding of the reader, an example will now be elaborated upon and followed through in the description of method 300. However, as all examples herein, this example should not be construed as limiting. In this example, if it known that the power supply current consumption levels of a normal device generally increase with decreasing MOS transistor threshold values, the measurements from a wafer-level electrical test operation of MOS transistor threshold values that have been stored in Manufacturing DB Server 190 during earlier manufacturing operations may be extracted, based on the current DUT's source wafer identity. Continuing with this example, an algorithm may then be applied by Evaluator 108 in which pass/fail limits for power supply current consumption are calculated based on the modeled relationship (of normal devices) between power supply current consumption and MOS transistor threshold voltage. Continuing with this example, the actual power supply current consumption measurement from the current DUT's final test operation may be compared to the calculated pass/fail limit, and if failing that limit, Evaluator 108 will override the (provisional) bin that was determined for the DUT by Test Program 112, reassigning the (permanent) bin to one consistent with power supply current consumption failure.

In the illustrated embodiments of method 300 in stage 304, Unit Handler 170 places the DUT to be tested in a test socket and then sends a "ready" signal. The DUT remains socketed (stage 308) until stage 368 (described below). Execution of Test Program 112 is initiated in stage 312. For instance in System 100A, System Controller 220A receives the ready signal via Handler Interface 106A and then initiates execution of Test Program 112. In another instance in System 100B, Test Station Host Computer 180B receives the ready signal via Handler Interface 106B and then initiates execution of Test Program 112 by passing a "start test" instruction to System Controller 120B through System Interface 140B. During Test Program 112 execution, Test Program 112 sequentially executes a series of physical tests, including one in which DUT identifier data are read (as described above), and optionally also including one or more tests which produce parametric data-sets to be evaluated. In stage 316, the DUT identifier data are transferred to Evaluator 108. Optionally in stage 320, parametric data are also transferred to Evaluator 108. For instance in System 100A, System Controller 120A retrieves the DUT identity (i.e. identifier) data and/or parametric data from Test Site Controller Memory 113 and copies the data to System Memory 130, the data then being accessible to Evaluator 108A. In another instance in System 100B, System Controller 120B may retrieve the DUT identity data and/or parametric data from Test Site Controller Memory 113 and send the data to Computer Memory 185 through System Interface 140B, the data then being accessible to Evaluator 108B. Test Program 112 continues execution of tests (stage 324), while Evaluator 108 executes in parallel beginning with stage 328. In the illustrated embodiment in stage 328, Evaluator 108 issues a request to Manufacturing DB Server 190 to return a particular set of manufacturing data related to the DUT identity data. The request is received, and requested data are returned to Evaluator 108 by Manufacturing DB Server 190 in stage 332. The invention does not limit the returned data. For the example described in the preceding paragraph, the MOS transistor threshold data measured during a prior electrical test operation on the wafer of the current DUT may be returned by Manufacturing DB Server 190, based on the current DUT's wafer identity data provided by Evaluator 108 in stage 328. Arriving at stage 336, Evaluator 108 algorithm execution begins, utilizing the data retrieved from Manufacturing DB Server 290 and optionally parametric measurement data. The invention does not limit the data used. However continuing with the same example, the relayed parametric data could be the measured power supply current level of the current DUT, for which pass/fail limits based on MOS transistor threshold data from prior electrical testing are determined. In some embodiments, the algorithm applied may additionally or alternatively accumulate and utilize data-sets derived from some of the previously tested DUTs (for instance as described with reference to FIG. 2).

In the illustrated embodiments in stage 340, Evaluator 108 determines if there is an algorithm failure, and routes the flow through the passing path or failing path, accordingly. Continuing with the example described above, Evaluator 108 may compare the parametric test data from the DUT to the pass/fail limits previously determined, and route the flow through the passing path or failing path, accordingly. If failing, in stage 344 Evaluator 108 sets a failure flag. If passing, no action is taken. Note that if more than one parametric data-set of interest to the algorithm(s) is generated in the course of the physical testing performed by Test Program 112, then in some embodiments the stages described from stage 336 to stage 344 (inclusive) will be executed for each parametric data-set requiring processing by Evaluator 108, with one or more failure flags allocated to record the result(s) of the data evaluation (s) performed. Similarly, if there is more than one type of manufacturing data required for the algorithm (or algorithms) executed by Evaluator 108, then in some embodiments the stages described from step 328 to step 332 (inclusive) will be executed sequentially or in parallel to retrieve all required data. Note also that, in some embodiments with multiple parameters of interest to the algorithm, the details of the algorithm applied may vary between the parameters whose data are being evaluated, such that Parameter A may be evaluated according to the conditions of Algorithm A, and Parameter B may be evaluated according to the conditions of Algorithm B, and so on. Continuing with the example described above, power supply current consumption may be evaluated based on pass/fail limits whose values depend on previously measured MOS transistor threshold, retrieved from Manufacturing DB Server 190 in stage 332, while a second parametric obtained from execution of Test Program 112 on the current DUT may be evaluated based on pass/fail limits whose values depend on a different type of data retrieved from Manufacturing DB Server 190 in step 332 (for instance, a type of data within Manufacturing DB Server 190 other than MOS transistor threshold measurements from a previous electrical test operation).

In the illustrated embodiments in stage 348, Evaluator 108 then waits for Test Program 112, which has been continuing physical testing simultaneously, until Test Program 112 reaches its end in stage 352. In stage 356, after Test Program 112 has ended, the Test Program bin assignment (i.e. the provisional binning assignment) is transferred to Evaluator 108. For instance in System 100A, System Controller 120A may retrieve the provisional binning assignment from Test Site Controller Memory 113 and copy the provisional binning assignment to System Memory 130, the provisional binning assignment then being accessible to Evaluator 108A. In another instance in System 100B, System Controller 120B may retrieve the provisional binning assignment from Test Site Controller Memory 113 and send the provisional binning assignment to Computer Memory 185 through System Interface 140B, the provisional binning assignment then being available to Evaluator 108B. In stage 360 Evaluator 108 continues execution by overriding the (provisional) Test Program bin assignment if one or more of the algorithm failure flag(s) is/are set. Otherwise if no failure flag is set, Evaluator 108 allows the Test Program bin assignment to remain unchanged meaning that the permanent binning assignment concurs with the provisional binning assignment. For the case in which the Test Program's bin assignment is overridden, and in which several handler bins are available for material segregation, the specific (permanent) bin reassignment by Evaluator 108 in stage 360 may be a function of the failure flags that have been set, or may be a function of a logical combination of the states of the various failure flags. For instance, a device for which Parameter A failure is indicated by Failure Flag A may be assigned to Handler Bin A, while a device for which Parameter B failure is indicated by Failure Flag B may be assigned to Handler Bin B. Continuing with this instance, a device that has been evaluated to fail the criteria for both Parameter A and Parameter B, as indicated by Failure Flag A and Failure Flag B, may be assigned to Handler Bin C.

In the illustrated embodiments in stage 364 the permanent binning assignment is transferred to Unit Handler 170. For instance in System 100A, System Controller 120A forwards the permanent bin assignment from Evaluator 108 to Unit Handler 170, via Handler Interface 106A. In another instance, in System 100B Test Station Host Computer 180B forwards the permanent bin assignment from Evaluator 108B to Unit Handler 170, via Handler Interface 106B. The binning instruction is received by Unit Handler 170 in stage 368, causing Unit Handler 170 to remove the current DUT (whose testing has been completed) and to place the DUT in the indicated bin. In step 372, Unit Handler 170 determines whether there are more untested devices remaining, and if so, returns to stage 304 to place the next DUT in the test socket. If there are no further devices to test, method 300 ends.

In some embodiments based on FIG. 3, instead of requesting and receiving data from Manufacturing Database Server 190 on a DUT by DUT basis, relevant data from Manufacturing Database Server 190 may be copied in bulk periodically to System Memory 130 and/or Computer Memory 185. For example, in one of these embodiments, relevant data may be copied each time a new lot is loaded for processing. In these embodiments, each time stage 328 and 332 are executed for a particular DUT, Evaluator 108 accesses the particular set of manufacturing data related to the DUT identity data from System Memory 130 and/or Computer Memory 185 rather than from Manufacturing Database Server 190. In some cases, the accessing of the data from System Memory 130 and/or Computer Memory 185 rather than from Manufacturing Database Server 190 may increase the speed of access.

Figure 4:
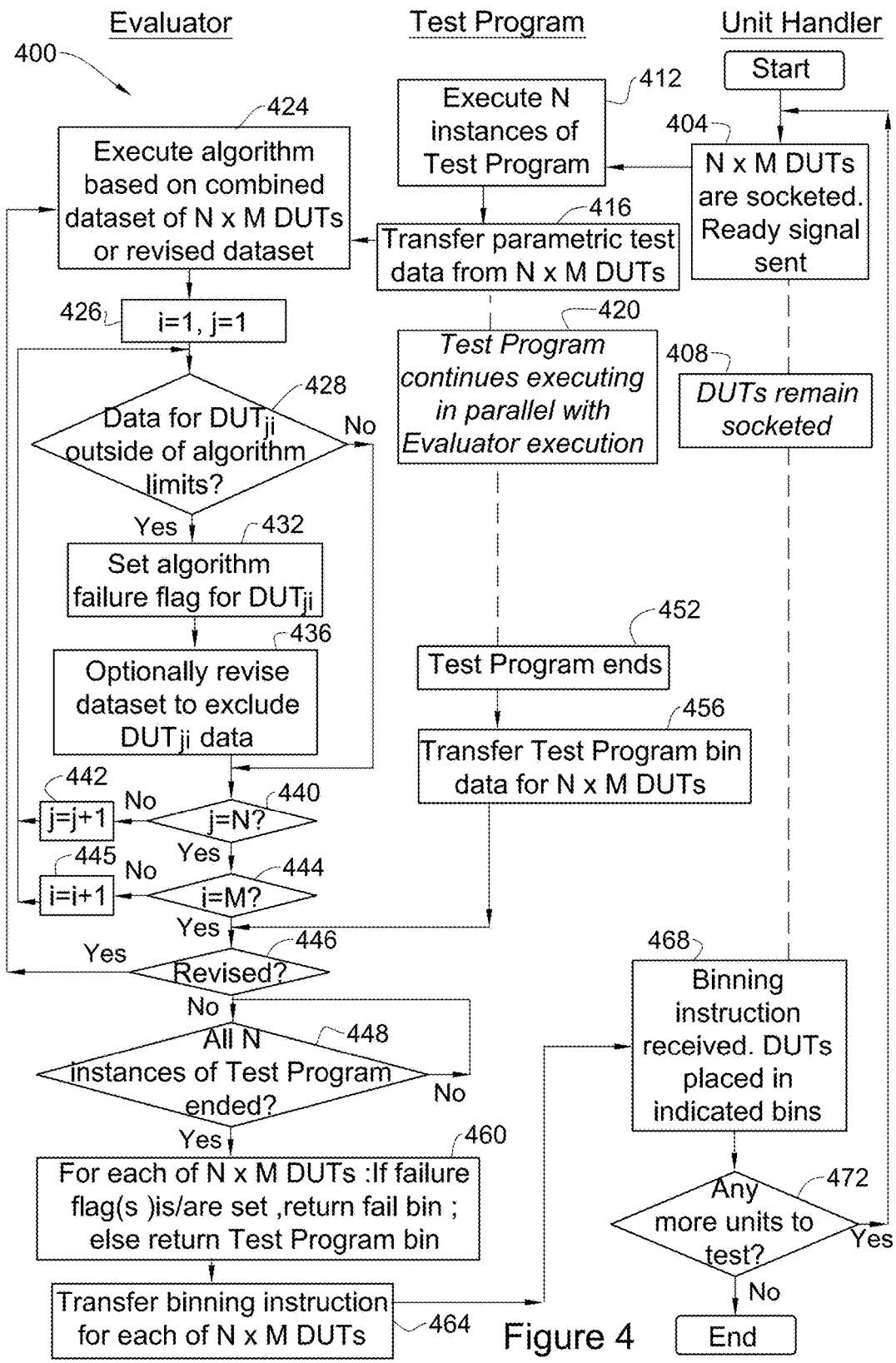
FIG. 4 is a flowchart of a method of using measurements derived from testing multiple devices in parallel at a final test operation in defining a permanent binning assignment, according to some embodiments of the present invention.

In embodiments of the invention involving final test operations supporting the testing and handling of multiple devices in parallel, test algorithms based on combining data derived from the multiple devices in real-time, as final test is occurring, may be enabled. FIG. 4 is a flowchart of a method of using measurements derived from testing multiple devices in parallel at a final test operation in defining a permanent binning assignment, according to some embodiments of the present invention. Method 400 is executed by system 100. In some embodiments, stages which are shown in FIG. 4 as being executed sequentially may be executed in parallel and/or stages shown in FIG. 4 as being executed in parallel may be executed sequentially. In some embodiments method 400 may include more, less and/or different stages than illustrated in FIG. 4. In some embodiments, stages may be executed in a different order than illustrated in FIG. 4.

For further understanding of the reader, an example of a test algorithm to which parallel test capability could be applied will now be elaborated upon and followed through in the description of method 400. However, as all examples herein, this example should not be construed as limiting. For this example, consider a case in which one wishes to reject devices that fail to exhibit an expected relationship between two parameters measured during final test, defined by a function described by the entire set of data collected from the group of devices presently being tested in parallel. For example, defining "Intrinsic Frequency" as the frequency of oscillation of an on-chip ring oscillator, and "Fmax" as the highest operating clock frequency under which any individual device remains fully functional, one may expect a linear relationship between the two. That is, if a plot is made of the individual Intrinsic Frequency and Fmax values derived from individual devices, the plot may show that as Intrinsic Frequency increases, Fmax also increases. The equation for a line modeling the dataset may be defined by way of a "least squares" computation, and based on this line, reject any devices that fail to demonstrate the expected relationship between the two parameters. Continuing with the example, if the distance of an individual point from the line, known as its "residual", exceeds a calculated threshold the device from which the Intrinsic Frequency and Fmax values of the point were obtained is rejected. In the illustrated embodiments of FIG. 4, such a calculation may be made as final test occurs on a group of devices tested in parallel, utilizing the correlated Intrinsic Frequency and Fmax datasets obtained from the group to determine the "best fit" line to those data, and to calculate a statistically relevant pass/fail threshold for rejection of individual devices. The acquisition of the datasets, the calculation of the statistically relevant limit, and the reassigning of the test program binning based on evaluation of individual DUT data with respect to that limit, are all enabled in real-time by the embodiments described with reference to FIG. 4 in parallel final test operation.

In the illustrated embodiments in stage 404, Unit Handler 170 places the N×M DUTs to be tested in test sockets, simultaneously or not simultaneously, and then sends a "ready" signal (where, N≥1, M≥1, N×M≥2). The DUTs remains socketed (stage 408) until stage 468 (described below). For instance in System 100A, System Controller 220A receives the ready signal via Handler Interface 106A and then initiates execution of N instance(s) of Test Program 112. In another instance in System 100B, Test Station Host Computer 180B receives the ready signal via Handler Interface 106B and then initiates execution of N instance(s) of Test Program 112 by passing a "start test" instruction to System Controller 120B through System Interface 140B. Execution of N instance(s) of Test Program 112 is initiated in stage 412 to perform physical test sequences on all N×M DUTs simultaneously. Each instance of Test Program 112 sequentially executes a series of physical tests, including one or more tests producing parametric data-sets of interest, from which statistical and/or relational features are later derived in stage 424 (see description below). In stage 416, the parametric data are transferred to Evaluator 108. For instance, in System 100A, System Controller 120A retrieves the parametric data for all N×M DUTs presently being tested from Test Site Controller Memory/ies 113 and copies the data to System Memory 130, the data then being accessible to Evaluator 108A. As another instance, in System 100B, System Controller 120B retrieves the parametric data for all N×M DUTs presently being tested from Test Site Controller Memory/ies 113 and sends the data to Computer Memory 185 through System Interface 140B, the data then being accessible to Evaluator 108B. Depending on the embodiment, the data from a particular DUT may be transferred as generated or the data may be transferred together with data from other DUTS (such as from the other DUTs being tested by the same instance of Test Program 112) or from all the DUTs being tested in parallel. The N instance(s) of Test Program 112 continue(s) execution of tests (stage 420), while Evaluator 108 executes in parallel beginning with stage 424.

In the illustrated embodiments in stage 424, Evaluator 108 executes an algorithm based on a combined data-set containing some or all of the data derived from test program execution on the N×M DUTs presently being tested in the parallel test arrangement. Depending on the embodiment, for a given DUT the algorithm may use data from all N×M DUTs being tested in parallel, or from a subset of the N×M DUTs being tested in parallel. For simplicity's sake, the description of FIG. 4 assumes that the algorithm uses data from all N×M DUTs being tested in parallel. In some embodiments, the algorithm applied may accumulate and utilize data-sets derived from some of the previously tested N×M parallel test groups (for instance as described with reference to FIG. 2) instead of or in addition to the data derived from the N×M DUTs of the present final test socketing. Additionally or alternatively, in some embodiments, the algorithm applied may utilize manufacturing data from Manufacturing DB Server 190 or from a copy thereof (for instance as described with reference to FIG. 3) instead of or in addition to the data derived from the N×M DUTs of the present final test socketing.

In the case of the example described above involving two correlated parameters, such as Intrinsic Frequency and Fmax, stage 424 would execute a calculation of a line using a least-squares fit to those data after Intrinsic Frequency and Fmax data from all N×M DUTs, generated by the test program final test operation, have been received by Evaluator 108. Based on the calculated line, a value for the residual of each of the N×M data points would be calculated, representing each point's distance (or deviation) from its expected position on the line. Based on the statistical spread of the data from the calculated line, pass/fail limits would be calculated to be applied to these calculated residuals in stage 428.

In the illustrated embodiments in stage 428, Evaluator 108 compares the data of each of the N×M DUTs to the high and low algorithm pass/fail limits (previously determined in stage 424) and routes the flow through the passing path or failing path, accordingly. If failing, in stage 432 Evaluator 108 sets a failure flag for the failing DUT. If passing, no action is taken. The evaluation of the data of the N×M DUTs with respect to the pass/fail limits may be sequential for each of the N×M devices, as shown in the embodiment of FIG. 4. In other embodiments, the evaluation may be implemented in a fashion to simultaneously evaluate all N×M data points, or in other embodiments, may be implemented to perform a sequence of evaluations involving simultaneous evaluation of subsets of the N×M data points.

In the illustrated embodiments, if failing, then optionally in stage 436, Evaluator 108 may revise the dataset from which pass/fail limits are derived, rejecting the current data value(s) for any given DUT which has failed, and then return to stage 424 to perform the algorithm again, utilizing the revised set of data points (i.e. the data points of the DUTs which have not been excluded and are therefore "surviving"). In the illustrated embodiments, the optional revision to the target dataset, revision to pass/fail limits, and reevaluation of the data related to surviving individual DUTs may occur recursively, any number of times. For example, the revision of the dataset may be performed in order to filter out data which appears to be spurious. In one embodiment, the individual failure flags of the DUTs whose data are evaluated as failing in any of the passes through stage 432 are never reset in any subsequent passes, and at the conclusion in stage 460 these flags are used to establish each of the N×M DUTs binning. In the case of the example described above involving two correlated parameters, such as Intrinsic Frequency and Fmax, the sequence of stages 424 through 446 (inclusive) would occur once for each reevaluation of data. In each pass through this loop, the recalculation of the line using least-squares fit to the surviving data points would occur, along with recalculation of the value for the residuals of each of the surviving data points. Based on the revised statistical spread of the surviving data from the recalculated line, revised pass/fail limits would be determined and applied to the residuals in step 428.

In the illustrated embodiments, if more than one parametric data-set of interest is generated in the course of the test program physical testing, then the steps described from stages 424 to 446 (inclusive) will be executed for each parametric data-set requiring processing by Evaluator 108, with one or more failure flags allocated to record the result(s) of the data evaluation (s) performed for each one of the N×M DUTs in the current final test operation. Therefore, each of the N×M DUTs may have several failure flags uniquely associated with it. Note also that, in some embodiments, the details of the algorithm applied may vary between the parameters whose data are being evaluated, such that Parameter A may be evaluated according to the conditions of Algorithm A, and Parameter B may be evaluated according to the conditions of Algorithm B, and so on. In stage 448, Evaluator 108 waits for the N instance(s) of Test Program 112, which has been continuing physical testing simultaneously, until the N instance(s) of Test Program 112 reach(es) the end for all N×M DUTs in stage 452.

In the illustrated embodiments in stage 456 after the end of the N instance(s) of Test Program 112, the Test Program bin assignments (i.e. the provisional binning assignments) for all N×M DUTs are transferred to Evaluator 108. For instance in System 100A, System Controller 120A may retrieve the Test Program bin assignments for all N×M DUTs from Test Site Controller Memory/ies 113 and copy the Test Program bin assignments to System Memory 130, the assignment then being accessible to Evaluator 108A. In another instance in System 100B, System Controller 120B may retrieve the Test Program bin assignments for all N×M DUTs from Test Site Controller Memory/ies 113 and send the assignments to Computer Memory 185, the assignments then being accessible to Evaluator 108B. In stage 460 Evaluator 108 continues execution by overriding the (provisional) Test Program bin assignment of any given DUT if one or more of the algorithm failure flag(s) for that DUT is/are set. Otherwise if no failure flag is set for that DUT, Evaluator 108 allows the Test Program bin assignment to remain unchanged, meaning that the permanent binning assignment concurs with the provisional binning assignment. For the case in which the Test Program's bin assignment is overridden, and in which several handler bins are available for material segregation, the specific (permanent) bin reassignment by Evaluator 108 in stage 460 may be a function of the failure flags that have been set, or may be a function of a logical combination of the states of the various failure flags. For instance, a device for which Parameter A failure is indicated by Failure Flag A may be assigned to Handler Bin A, while a device for which Parameter B failure is indicated by Failure Flag B may be assigned to Handler Bin B. Continuing with this instance, a device that has been evaluated to fail the criteria for both Parameter A and Parameter B, as indicated by Failure Flag A and Failure Flag B, may be assigned to Handler Bin C.

In the illustrated embodiments in stage 464, the permanent binning assignments for all the N×M DUTs are transferred to Unit Handler 170. For instance in System 100A, System Controller 120A forwards the permanent bin assignments from Evaluator 108 to Unit Handler 170, via Handler Interface 106A. In another instance, in System 100B Test Station Host Computer 180B forwards the permanent bin assignments from Evaluator 108B to Unit Handler 170, via Handler Interface 106B. The binning instructions are received by Unit Handler 170 in stage 468, causing Unit Handler 270 to remove the current N×M DUTs (whose testing have been completed) and to place each DUT in the indicated bin, simultaneously or not simultaneously. In stage 472, Unit Handler 170 determines whether there are more untested devices remaining to be tested in parallel, and if so, returns to stage 404 to place the next group of DUTs to be tested in parallel in the test sockets. If there are no further devices to test, method 400 ends.

In alternate embodiments, any or all of the stages described with reference to FIG. 4 in which the data of the N×M devices are processed by Evaluator 108 as a group, for instance from stage 456 to stage 464 may be processed DUT-by-DUT. For example, if Test Program 112 execution has been completed on one or more of the N×M DUTs while it continues to execute on others of the N×M DUTs, for one or more of those DUTs whose physical testing is completed, some or all of the operations described in stages 456 to 464 may be performed ahead of the others that continue physical testing. In some embodiments, any or all of steps 456 to 464 may be performed asynchronously on individual DUTs from among the N×M DUT group of the current final test operation, as the individual DUTs complete their respective physical testing operations. For example, provisional binning assignments and/or permanent binning assignments may be transferred as generated and not necessarily in bulk for all N×M DUTs.

In some embodiments, algorithm requirements for final test may involve the combined use of elements from methods 200, 300, 400, and/or other method(s). The richness and potential complexity that embodiments of the invention may enable in deploying custom binning algorithms to a final test operation (without test program modification), is illustrated by the following hypothetical example which combines elements from methods 300 and 400. Consider embodiments of a multisite parallel final test operation in which 128 devices are being tested at a time, and that among the various tests conducted, device identifier bits are read from each device and logged, and also the maximum operating frequency of each device, Fmax, is logged as a parametric value. Any devices among the 128 tested in parallel that fail the test program retain the (provisional) handler binning assigned by the test program when their testing is complete (i.e. the permanent binning assignment concurs with the provisional binning assignment). However, any devices that pass the test program are evaluated by the evaluator according to the following algorithm, with the test program's passing (provisional) handler bin assignment reassigned by the evaluator to a failing bin for any devices that fail the algorithm (i.e. in this case the permanent binning assignment does not concur with the provisional binning assignment). In a variant embodiment of this example, devices that fail the test program are also evaluated by the evaluator according to the following algorithm, with the test program's failing (provisional) handler bin assignment reassigned by the evaluator to a passing bin for any devices that pass the algorithm.

In this example of a custom algorithm, it is given that a theoretical relationship exists between device Fmax frequency, device iddq current (i.e. the supply current in the quiescent state), and average wafer-level transistor gate length, measured at final test, wafer sort, and etest manufacturing operations, respectively. At any given wafer-level transistor gate length value, a linear correlation is expected between iddq and Fmax, in which non-defective devices produce a characteristic line with empirically determined slope and XY axis intercepts. For any given value of wafer-level average transistor gate length, as iddq increases, Fmax is also expected to increase (signal propagation delays decrease). Further, the average transistor gate length naturally varies between wafers, resulting in an increase of both iddq and Fmax with decreasing average transistor gate length.

Figure 5:
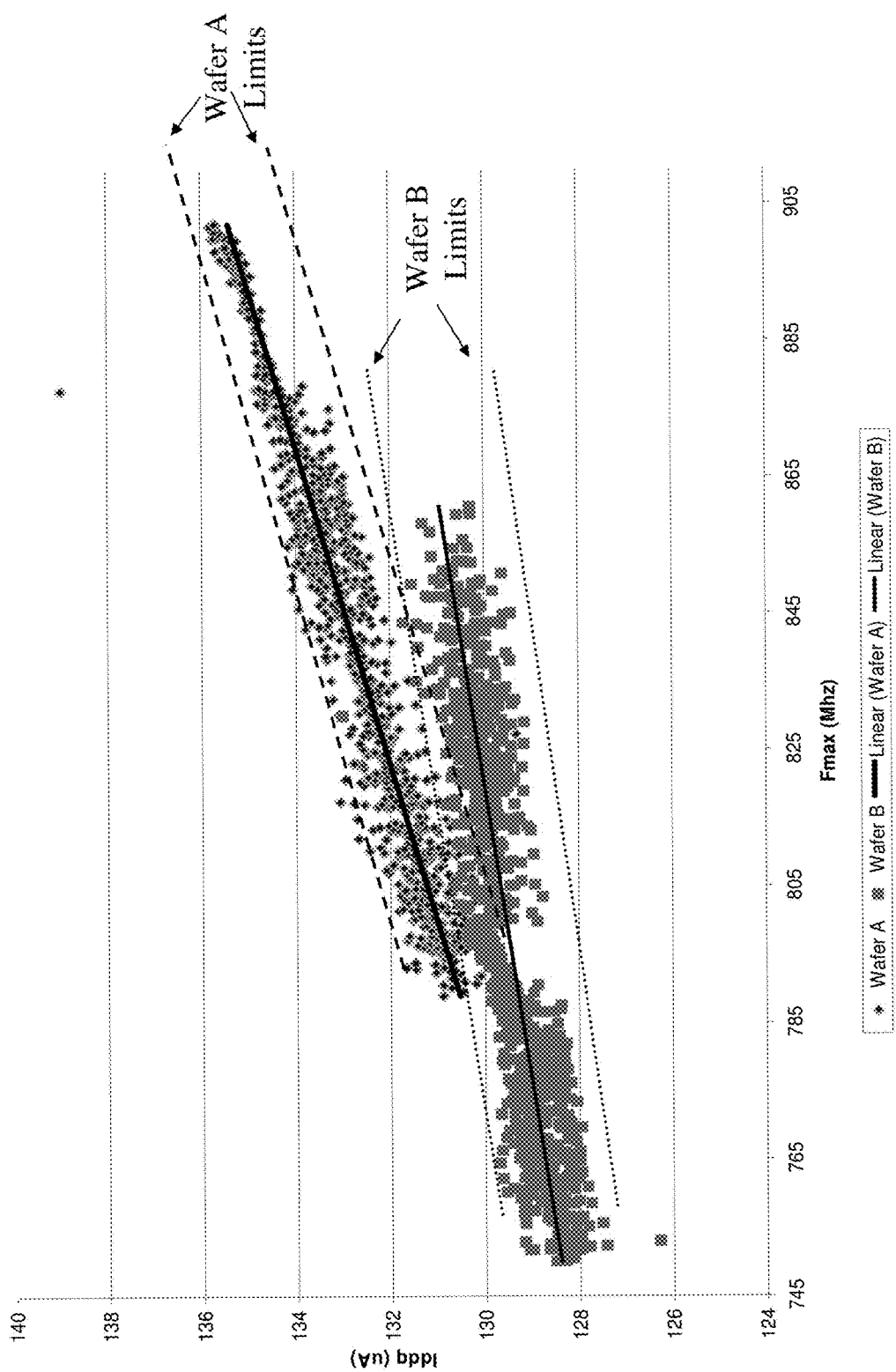
FIG. 5 is a graph of electrically measured parameters iddq and Fmax from final test and wafer sort manufacturing operations respectively for two wafers with different wafer-level transistor gate length values, according to some embodiments of the present invention.

FIG. 5 is a graph of electrically measured parameters iddq and Fmax from final test and wafer sort manufacturing operations respectively for two wafers with different wafer-level transistor gate length values, according to some embodiments of the present invention. In the embodiments illustrated in FIG. 5 the solid line among the data points for each wafer represents a least-squares fit to the data of iddq and Fmax for that wafer which could calculated, for example, by a least squares fit to a linear model. In the illustrated embodiments, Wafer B data are illustrative of material with longer transistor gate lengths and Wafer A data are illustrative of material with shorter transistor gate lengths.

In this example, the device identifier bits that have been read from each device may be used as reference to the wafer sort data (device-level iddq) and etest data (wafer-level average transistor gate length) to extract these data from the manufacturing database (or from a copy in memory), and in combination with the Fmax data derived from the present final test operation, establish whether or not the devices passing the test program exhibit a characteristic consistent with the expected relationships. Various statistical criteria could be defined and applied to these data to establish pass/fail limits, based on the distribution of normal, non-defective devices.

For instance referring to FIG. 5, the boundaries in dashed lines may in some embodiments represent the limits that are applied by the evaluator in evaluating each device. Any devices falling outside of the limits associated with their wafer-of-origin (given the iddq and Fmax data of those devices) will be designated as failing. Such devices, assumed to have been identified as passing by the test program, will have handler binning reassigned by the evaluator to a failing bin instead, meaning that in this case the permanent binning assignment will not concur with the provisional binning assignment.

The algorithm in the above example could be made arbitrarily richer in innumerable ways. For instance, one might also incorporate an "or" condition for failure in which the Fmax value of each device is compared to the statistical distribution of all Fmax values derived from all of the passing devices of the 128 being tested in parallel. With this addition, the algorithm would fail any device whose Fmax/iddq relationship is inconsistent with the average transistor gate length of its wafer-of-origin and also fail any device whose Fmax value is statistically too low (or too high) compared to the distribution of Fmax data derived from the other 127 devices simultaneously under test.

It will be understood that in some embodiments any system of the invention or part of a system of the invention may be a suitably programmed computer. Likewise, the invention contemplates a computer program being readable by a computer for executing one or more methods or sub-methods of the invention. The invention further contemplates a machine-readable memory tangibly embodying a program of instructions executable by the machine for executing one or more methods or sub-methods of the invention.

While the invention has been shown and described with respect to particular embodiments, it is not thus limited. Numerous modifications, changes and improvements within the scope of the invention will now occur to the reader.

The invention claimed is:

1. A system for sorting, comprising:
   an evaluator configured to:
      receive a provisional binning assignment for an electronic device determined based on first data generated by a test program configured to determine said provisional binning assignment for said electronic device;
      define a permanent binning assignment for said electronic device, inserted in a test socket of a test tool that is performing a test operation according to said test program, said permanent binning assignment is based at least in part on both of: said first data for determining said provisional binning assignment, and second data different from said first data, and
      output said permanent binning assignment so that after said test operation is completed, said electronic device is removed from said test socket and placed in one of a plurality of bins in accordance with said permanent binning assignment.

2. The system of claim 1, wherein said second data includes data relating to at least one other electronic device being tested in parallel with said electronic device.

3. The system of claim 1 wherein said second data includes data from a manufacturing operation which precedes said test operation.

4. The system of claim 3, wherein said data from a manufacturing operation relates to said electronic device.

5. The system of claim 3, wherein said data from a manufacturing operation relates to at least one other electronic device.

6. The system of claim 3, wherein said data from the manufacturing operation includes data associated with device identifier data read during execution of said test program.

7. The system of claim 1, wherein said second data includes data from the same test operation performed earlier on at least one other electronic device.

8. The system of claim 1, wherein said second data includes data from a manufacturing operation which follows said test operation.

9. The system of claim 1, wherein said second data includes dynamic criteria data relating to said permanent binning assignment.

10. The system of claim 1, wherein said second data includes at least one of parametric test data or functional test data for said device.

11. The system of claim 1, wherein said evaluator is located on automatic test equipment.

12. The system of claim 1, wherein said evaluator is located external to automatic test equipment.

13. The system of claim 1, further comprising: a manufacturing database interface to provide access to data from a manufacturing database server for use by said evaluator in defining said permanent binning assignment.

14. The system of claim 1, further comprising: a handler to insert said device into said test socket prior to said final test operation, and after said final test operation to remove said electronic device from said test socket and place said electronic device in one of said plurality of bins in accordance with the permanent binning assignment defined by said evaluator.

15. The system of claim 14, further comprising: a handler interface to transfer the permanent binning assignment defined by said evaluator to said handler.

16. The system of claim 1, wherein said second data includes a frequency with which provisional binning assignments for previously tested electronic devices defined by said test program agree with permanent binning assignments for said previously tested electronic devices defined by said evaluator.

17. The system of claim 1, where said evaluator has at least one of: access to data not available for said binning assignment for said electronic device defined by said test program, a resource not available for said binning assignment for said electronic device defined by said test program, or an ability not available for said binning assignment for said electronic device defined by said test program.

18. The system of claim 1, wherein said second data includes other data not used to determine said provisional binning assignment.

19. The system of claim 1, wherein said permanent binning assignment defined by said evaluator results from processing that includes execution of an algorithm that excludes at least one of: product specific requirements, tester specific requirements, or test operation specific requirements.

20. The system of claim 1, wherein said second data includes device identifier data.

21. A method of sorting, comprising:
  receiving a provisional binning assignment for an electronic device determined based on first data generated by a test program configured to determine said provisional binning assignment for said electronic device;
  defining a permanent binning assignment for said electronic device inserted in a test socket of a test tool that is performing a test operation according to said test program, said permanent binning assignment is based at least in part on both of: said first data for determining said provisional binning assignment and second data different from said first data; and
  outputting said permanent binning assignment so that after said test operation is completed, said electronic device is removed from said test socket and placed in one of a plurality of bins in accordance with said permanent binning assignment.

22. The system of claim 21, wherein said second data includes data associated with device identifier data read during execution of said test program.

23. The system of claim 21, wherein said evaluator is located on automatic test equipment.

24. The system of claim 21, wherein said evaluator is located external to automatic test equipment.

25. The system of claim 21, further comprising a manufacturing database interface to provide access to data from a manufacturing database server for use by said evaluator in defining said permanent binning assignment.

26. The system of claim 21, further comprising: a handler to insert said device into said test socket prior to said final test operation, and after said final test operation to remove said electronic device from said test socket and place said electronic device in one of said plurality of bins in accordance with the binning assignment defined by said evaluator.

27. The system of claim 21, wherein said permanent binning assignment defined by said evaluator results from processing that includes execution of an algorithm that excludes at least one of: product specific requirements, tester specific requirements, or test operation specific requirements.

28. A non-transitory computer program product comprising a computer useable medium having computer readable program code embodied therein for sorting, the computer program product comprising:
  computer readable program code for causing a computer to:
    receive a provisional binning assignment for an electronic device determined based on first data generated by a test program configured to determine said provisional binning assignment for said electronic device;
    define a permanent binning assignment for said electronic device inserted in a test socket of a test tool that is performing a test operation according to said test program, said permanent binning assignment is based at least in part on both of: said first data for determining said provisional binning assignment and second data different from said first data; and
  computer readable program code for causing the computer to output said binning assignment so that after said test operation is completed, said electronic device is removed from said test socket and placed in one of a plurality of bins in accordance with said binning assignment.

* * * * *